US006936514B1

(12) United States Patent
Pelella

(10) Patent No.: US 6,936,514 B1
(45) Date of Patent: Aug. 30, 2005

(54) SEMICONDUCTOR COMPONENT AND METHOD

(75) Inventor: Mario M. Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/818,729

(22) Filed: Apr. 5, 2004

(51) Int. Cl.[7] .......................................... H01L 21/8242
(52) U.S. Cl. ..................... 438/250; 438/251; 438/253; 438/396
(58) Field of Search ................................ 438/250, 251, 438/253, 254, 393–397, 386, 387, 239, 244, 438/246

(56) References Cited

U.S. PATENT DOCUMENTS

| 5,340,754 A | | 8/1994 | Witek et al. |
| 5,759,907 A | * | 6/1998 | Assaderaghi et al. ....... 438/386 |
| 5,807,776 A | * | 9/1998 | Tang .......................... 438/253 |
| 5,841,172 A | | 11/1998 | Morishita et al. |
| 5,889,293 A | | 3/1999 | Rutten et al. |
| 6,384,676 B2 | | 5/2002 | Kasa et al. |
| 6,534,831 B2 | | 3/2003 | Kato |
| 6,621,108 B2 | | 9/2003 | Tashiro et al. |

* cited by examiner

*Primary Examiner*—Wael Fahmy
*Assistant Examiner*—Ginette Peralta
(74) *Attorney, Agent, or Firm*—Rennie Wm. Dover; Paul Drake

(57) ABSTRACT

An SOI semiconductor component having a portion of a circuit element in the handle wafer and a method for manufacturing the SOI semiconductor component. An SOI substrate has a handle wafer bonded to an active wafer via a dielectric material. A shallow trench isolation structure is formed from the active wafer. A plate or electrode of a capacitor is manufactured in the handle wafer. The other plate or electrode of the capacitor is formed through the shallow trench isolation structure. A circuit element is manufactured in the active wafer such that the manufacturing steps for forming the capacitor and those for forming the circuit element may be decoupled from each other.

25 Claims, 9 Drawing Sheets

SEMICONDUCTOR COMPONENT AND METHOD

FIELD OF THE INVENTION

The present invention relates, in general, to a semiconductor component and, more particularly, to a Semiconductor-On-Insulator semiconductor component.

BACKGROUND OF THE INVENTION

Semiconductor component manufacturers are constantly striving to increase the speeds of their components. Because a semiconductor component, such as a microprocessor, contains up to a billion transistors or devices, the focus for increasing speed has been at the transistor level. One technique for improving performance has been to identify the critical circuit elements on a semiconductor chip and enhance the processing steps for their manufacture. For example, in circuit elements such as Insulated Gate Field Effect Transistors (IGFETs), semiconductor component manufacturers have engineered the drain sides and source sides of the IGFETs to lower the capacitance and resistance associated with these regions. In addition, they have improved the performance of IGFETs by engineering their channel regions. However, enhancing the performance of these transistors has degraded the performance of other transistors in the semiconductor chip. Thus, semiconductor component manufacturers sacrifice the performance of some of the circuit elements in a semiconductor chip while enhancing the performance of other circuit elements in the semiconductor chip to achieve an overall performance improvement.

Accordingly, what is needed is a semiconductor component and a method for manufacturing the semiconductor component that permits optimizing more of the circuit elements in a semiconductor chip.

SUMMARY OF THE INVENTION

The present invention satisfies the foregoing need by providing a semiconductor component comprising a capacitor manufactured from an SOI substrate and a method for fabricating the semiconductor component. A first electrode of a capacitor is fabricated in the handle layer of the SOI substrate. In accordance with one aspect, the present invention includes a semiconductor component formed from a Semiconductor-On-Insulator (SOI) substrate comprising a first layer of dielectric material disposed on a first layer of semiconductor material having a first surface and a second layer of semiconductor material disposed on the first layer of dielectric material. The first plate or electrode of the capacitor is formed from the first layer of semiconductor material. A layer of dielectric material is disposed on the first plate and a second plate or electrode of the capacitor is disposed on the layer of dielectric material.

In accordance with another aspect of the present invention, the second plate or electrode of the capacitor is formed by depositing doped polysilicon over the layer of dielectric material. Additional doped polysilicon is formed over the doped polysilicon, wherein the concentration of impurity material in the doped polysilicon is greater than the concentration of the additional doped polysilicon. The additional doped polysilicon may be deposited directly on the doped polysilicon or spaced apart from the doped polysilicon by a dielectric material.

In accordance with another aspect, the present invention includes a method for manufacturing a semiconductor component comprising providing an SOI substrate. The SOI substrate has a first layer of dielectric material disposed on the semiconductor layer surface of a first layer of monocrystalline semiconductor material and a second layer of monocrystalline semiconductor material disposed on the first layer of dielectric material. A shallow trench isolation structure is formed in the second layer of dielectric material. An opening is formed in the shallow trench isolation structure that exposes a portion of the semiconductor layer surface. A capacitor dielectric layer is formed on the exposed portion of the semiconductor layer surface. A first polysilicon layer of a first conductivity type and a first dopant concentration is formed on the capacitor dielectric layer.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally the present invention provides a semiconductor component comprising a Semiconductor-On-Insulator (SOI) substrate having two layers of monocrystalline semiconductor material separated by an insulating material, wherein a plate or electrode of a capacitor is manufactured from one of the layers of semiconductor material and a circuit element is manufactured from the other layer of semiconductor material. Typically, an SOI substrate is comprised of a support wafer or handle wafer separated from an active or device wafer by a dielectric material. The support wafer and the device wafer are monocrystalline semiconductor wafers. In accordance with the present invention, a plate of a capacitor is manufactured from the handle wafer. The other plate of the capacitor is manufactured from a portion of one or more layers of polysilicon. Other portions of the one or more polysilicon layers can be used to manufacture gate electrodes, dummy gate electrodes, or other current conducting structures. An advantage of using polysilicon to manufacture the other plate of the capacitor is that it can be manufactured using a portion of a polysilicon layer that is already present in most semiconductor component manufacturing flows. In addition, the dielectric material of the capacitor can be derived from a dielectric formation step that is used to form dielectric materials used for other circuit elements of the semiconductor component. Thus, an advantage of the present invention is that it can be integrated into many different semiconductor manufacturing process flows.

Figure 1:
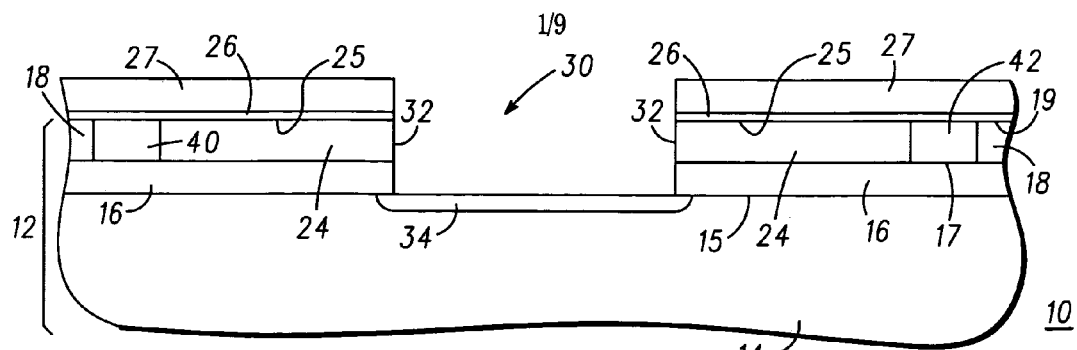
FIG. 1 is a cross-sectional side view of an SOI semiconductor component comprising a capacitor at a beginning stage of manufacture in accordance with an embodiment of the present invention.

FIG. 1 is a cross-sectional side view of a semiconductor component 10 comprising a capacitor at a beginning stage of manufacture in accordance with an embodiment of the present invention. What is shown in FIG. 1 is a Semiconductor-On-Insulator (SOI) substrate 12 comprising a layer of insulating material 16 sandwiched between two layers of monocrystalline semiconductor material 14 and 18. Preferably, SOI substrate 12 comprises a layer of P-type monocrystalline silicon 14 having a surface 15 and a thickness ranging from about 500 micrometers ($\mu$m) to about 1,000 $\mu$m. Insulating material 16 comprises oxide having a surface 17 and a thickness ranging from about 500 Angstroms (Å) to about 2,000 Å. Silicon layer 18 comprises P-type monocrystalline silicon having a surface 19 and a thickness ranging from about 50 Å to about 1,000 Å. Techniques for manufacturing SOI substrate 12 are known to those skilled in the art. In an SOI substrate, silicon layer 14 provides structural support for substrate 12 whereas semiconductor devices are manufactured from silicon layer 18. Thus silicon layer 18 serves as an active layer. An advantage of the present invention is that a portion of a silicon device can be manufactured from silicon layer 14. Therefore, silicon layer 18 not only serves as a handle wafer but also as a portion of the active layer.

A Shallow Trench Isolation (STI) structure 24 having a surface 25 is formed in silicon layer 18. Although a single isolation structure 24 is shown, it should be understood this is not a limitation of the present invention and that a plurality of isolations structures may be formed. As those skilled in the art are aware, STI structure 24 electrically isolates regions within silicon layer 18 from each other. STI structure 24 prevents cross talk between semiconductor devices or circuit elements formed in the different regions of silicon layer 18. Circuit elements 40 and 42 are shown as being formed from silicon layer 18 and are included in FIG. 1 for the sake of completeness. Circuit elements 40 and 42 may include active circuit elements such as, for example, transistors or diodes, passive circuit elements such as, for example, resistors, capacitors, or inductors, or a combination of active and passive circuit elements. To simplify the description of the present invention, the steps for manufacturing circuit elements 40 and 42 have not been included. Although circuit elements 40 and 42 are shown in block form as being completed devices in FIG. 1, it should be understood they can be manufactured before, after, or concurrently with the capacitor that is manufactured in part from silicon layer 14. Preferably, the fabrication of a capacitor from silicon layer 14 and silicon layer 18 is integrated with the manufacture of circuit elements such that they are manufactured contemporaneously with each other. In other words, many of the processing steps for manufacturing the capacitors from silicon layers 14 and 18 and for manufacturing circuit elements from silicon layer 18 are common or shared.

A layer of dielectric material 26 is formed on silicon layer 18 and STI structure 24. Suitable materials for dielectric layer 26 include oxide, high dielectric constant dielectric materials, nitride, and an oxide-nitride-oxide dielectric stack.

A layer of photoresist 27 is disposed on and patterned to expose a portion of dielectric layer 26. The portions of dielectric layer 26 unprotected by photoresist layer 27 are etched using an anisotropic reactive ion etch. In addition, the reactive ion etch anisotropically etches the portions of the dielectric material of STI structure 24 and dielectric layer 16 unprotected by patterned photoresist layer 27. The reactive ion etch forms an opening 30 having sidewalls 32 through STI structure 24 that extends to surface 15. It should be understood the amount of dielectric layer 16 that is removed is not a limitation of the present invention. Although, dielectric material 16 is shown as being removed to expose surface 15, it may be desirable to leave some of dielectric material 16 as an implant-screening mask.

An impurity material of N-type conductivity such as, for example, phosphorus is implanted through opening 30 and into silicon layer 14 to form a doped region 34. By way of example, the N-type impurity material is implanted at a dose ranging from about $1 \times 10^3$ ions per square centimeter (ions/ cm$^2$) to about 5×10$^{14}$ ions/cm$^2$ and an implant energy ranging from about 50 Kilo-electron Volts (KeV) to about 125 KeV.

Figure 2:
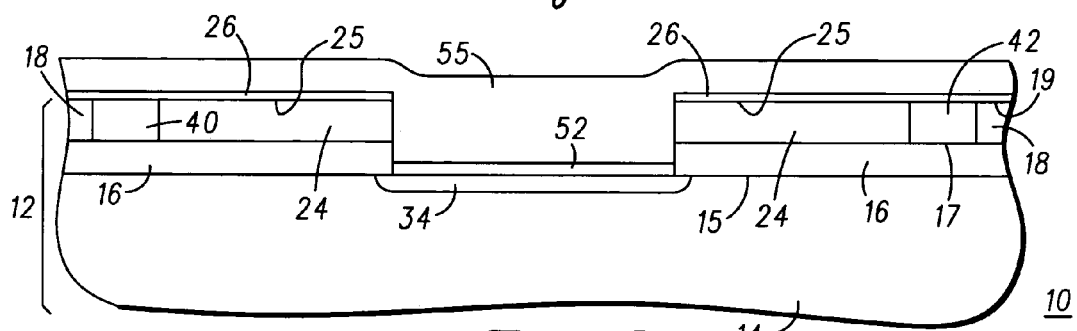
FIG. 2 is a cross-sectional side view of the semiconductor component of FIG. 1 at a later stage of manufacture.

Referring now to FIG. 2, photoresist layer 27 is removed using techniques known to those skilled in the art and a layer of dielectric material 52 is formed on the exposed portions of surface 15. By way of example, dielectric layer 52 is thermally grown oxide having a thickness ranging from about 10 Å to about 300 Å. Dielectric layer 52 serves as the dielectric material for a capacitor of semiconductor component 10. The thickness of dielectric layer 52 is selected in accordance with the desired capacitance value. The material of dielectric layer 52 is not a limitation of the present invention. Other suitable materials include dielectric materials having dielectric constants greater than 3.9, i.e., high dielectric constant materials, nitride, and an oxide-nitride-oxide dielectric stack. Although not shown, it should be understood that dielectric layer 52 can be formed as a conformal layer that lines the exposed portions of surface 15, sidewalls 32, and dielectric layer 26. Preferably, high dielectric constant materials such as, for example, nitride are formed as conformal layers. When dielectric layer 52 is a conformal layer, those skilled in the art will recognize how to form the conformal layer and how to modify the subsequent processing steps in the formation of semiconductor component 10.

A layer of doped polycrystalline semiconductor material 55 is formed over dielectric layer 52 using techniques known to those skilled in the art. By way of example doped polycrystalline semiconductor material 55 is doped polysilicon. As described with reference to FIG. 1, circuit elements 40 and 42 may be formed from silicon layer 18. When circuit elements 40 and 42 are formed concurrently with the capacitor, portions of dielectric layer 26 are removed from silicon layer 18 to allow their formation.

Figure 3:
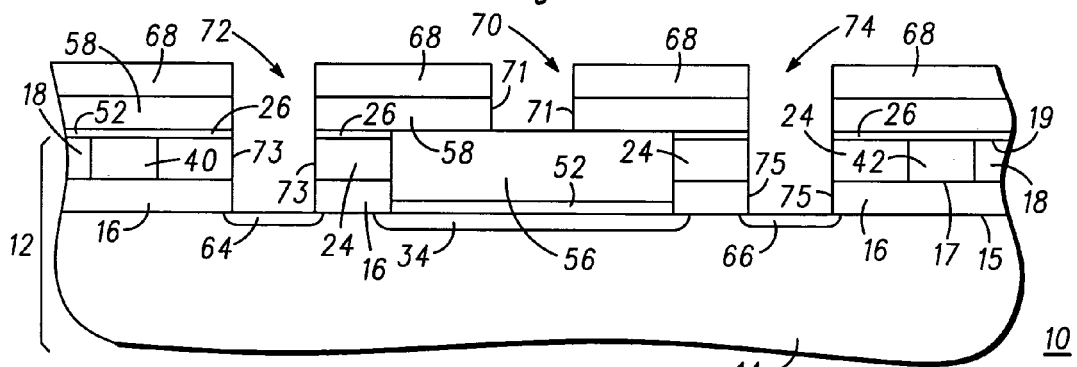
FIG. 3 is a cross-sectional side view of the semiconductor component of FIG. 2 at a later stage of manufacture.

Referring now to FIG. 3, doped polysilicon layer 55 is planarized using, for example, a Chemical Mechanical Polishing (CMP) technique selective to the material of dielectric layer 26. Thus, the planarization stops on dielectric layer 26. The remaining portion 56 of polysilicon layer 55 forms a portion of a capacitor electrode. A layer of dielectric material 58 having a thickness ranging from about 50 Å to about 500 Å is formed on portion 56 and on dielectric layer 26. A layer of photoresist 68 is formed on dielectric layer 58 and patterned to have openings that expose portions of dielectric layer 58. The exposed portions of dielectric layer 58 are etched using an anisotropic reactive ion etch to form openings 70, 72, and 74 having sidewalls 71, 73, and 75, respectively. The etch forming opening 70 stops on and exposes capacitor electrode portion 56. The etch forming openings 72 and 74 stops on and exposes portions of surface 15. An impurity material of N-type conductivity such as, for example, phosphorus is implanted through the openings and into silicon layer 14 to form doped regions 64 and 66. By way of example, the N-type impurity material is implanted at a dose ranging from about 1×10$^{15}$ ions/cm$^2$ to about 5×10$^{15}$ ions/cm$^2$ and an implant energy ranging from about 20 KeV to about 50 KeV. Although the implant further dopes capacitor electrode portion 56, the additional doping has not been shown for the sake of clarity. Alternatively, a layer of photoresist may be formed on dielectric layer 58 and patterned to re-open openings 72 and 74, but not opening 70. In this case, capacitor electrode portion 56 is not further doped.

Figure 4:
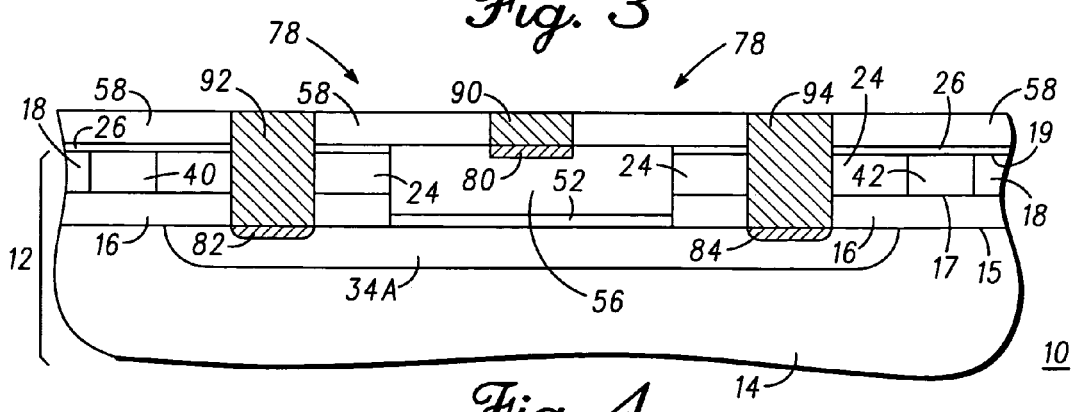
FIG. 4 is a cross-sectional side view of the semiconductor component of FIG. 3 at a later stage of manufacture.

Referring now to FIG. 4, photoresist layer 68 is removed and semiconductor component 10 is annealed by heating to a temperature ranging from about 800° C. to about 1,100° C. Annealing semiconductor component 10 causes the dopant in doped regions 34, 64, and 66 to diffuse laterally and vertically. Preferably, doped regions 34, 64, and 66 merge to form a single doped region 34A. Although it is preferable that doped regions 34, 64, and 66 merge, it may be that two or more of the doped regions do not merge. Doped regions 34, 64, and 66 are shown as extending the same depth into silicon layer 14. However, this is not a limitation of the present invention. When doped regions 34, 64, and 66 do not extend the same depth into silicon layer 14, doped region 34A will not have the uniform thickness shown in FIG. 4.

A layer of refractory metal (not shown) is conformally deposited over the exposed portions of capacitor electrode portion 56, doped region 34A, and dielectric layer 58. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 80 is formed from capacitor electrode portion 56 and nickel silicide layers 82 and 84 are formed from doped region 34A. Portions of the nickel over dielectric layer 58 and within openings 70, 72, and 74 remain unreacted. After formation of the nickel silicide layers, any unreacted nickel is removed, which re-opens openings 70, 72, and 74. It should be understood that the type of silicide is not a limitation of the present invention. For example, other suitable silicides include titanium silicide (TiSi), platinum silicide (PtSi), cobalt silicide (CoSi$_2$), or the like. As those skilled in the art are aware, silicon is consumed during the formation of silicide and the amount of silicon consumed is a function of the type of silicide being formed.

Dielectric layer 58 is an optional layer that prevents formation of silicide from the portions of silicon layer 18 that are not covered by dielectric layer 26. It is included in those applications in which it is desirable to prevent formation of silicide from silicon layer 18 while forming silicide from silicon layer 14. Dielectric layer 58 may not be included in those applications in which it is desirable to form silicide from silicon layer 18 while forming silicide from silicon layer 14.

A layer of electrically conductive material (not shown) is formed in openings 70, 72, and 74 and on dielectric layer 58. The layer of electrically conductive material is planarized using, for example, a CMP technique selective to dielectric layer 58. Thus, the planarization stops on dielectric layer 58 leaving electrically conductive plugs 90, 92, and 94. Doped region 34A, silicide layer 82, and conductive plug 92 cooperate to form one portion of a first electrode of a capacitor 78 and doped region 34A, silicide layer 84, and conductive plug 94 cooperate to form another portion of the first electrode of capacitor 78. Capacitor electrode portion 56, silicide layer 80, and conductive plug 90 cooperate to form the second electrode of capacitor 78. Dielectric material 52 serves as the dielectric material of capacitor 78. Preferably, the portions of the capacitor electrodes that include conductive plugs 92 and 94 are electrically coupled together. Although two conductive plugs, i.e., conductive plugs 92 and 94, cooperate to form an electrode of semiconductor component 10, it should be understood that one electrode of capacitor 78 may be comprised of doped region 34A, silicide layer 82, and conductive plug 92 and the other electrode may be comprised of capacitor portion 56, silicide layer 80, and conductive plug 90. Or, one electrode of capacitor 78 may be comprised of doped region 34A, silicide layer 84, and conductive plug 94 and the other electrode may be comprised of capacitor electrode portion 56, silicide layer 80, and conductive plug 90. In other words, only one electrode is formed from doped region 34A.

It should be understood the type of material for conductive plugs 90, 92, and 94 is not a limitation of the present invention. Other suitable materials for conductive plugs 90, 92, and 94 include doped polysilicon, doped selective epitaxial semiconductor material, tantalum, titanium, tungsten, aluminum, silver, copper, or the like. When conductive plugs 90, 92, and 94 comprise copper, it may be desirable to form a barrier layer over sidewalls 71, 73, and 75 and over dielectric layer 58 to prevent diffusion of copper within semiconductor component 10.

Figure 5:
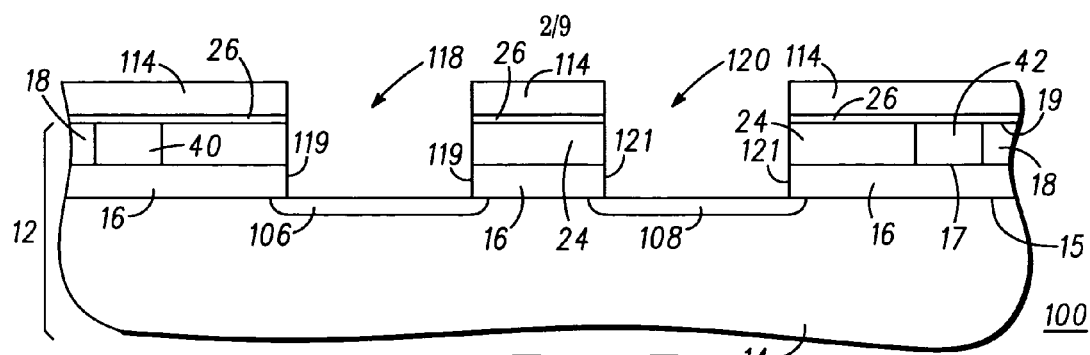
FIG. 5 is a cross-sectional side view of an SOI semiconductor component comprising a capacitor at a beginning stage of manufacture in accordance with another embodiment of the present invention.

FIG. 5 is a cross-sectional side view of a semiconductor component 100 comprising a capacitor at a beginning stage of manufacture in accordance with another embodiment of the present invention. What is shown in FIG. 5 is SOI substrate 12 having STI isolation structure 24 as described with reference to FIG. 1. A layer of photoresist 114 is patterned on dielectric layer 26 to have openings that expose portions of dielectric layer 26. The portions of dielectric layer 26, STI structure 24, and dielectric layer 16 unprotected by photoresist layer 114 are etched using an anisotropic reactive ion etch. The reactive ion etch forms openings 118 and 120 through dielectric layer 26, STI structure 24, and dielectric layer 16. Openings 118 and 120 have sidewalls 119 and 121, respectively, and extend to surface 15. Although, the unprotected portion of dielectric material 16 is shown as being completely removed, it may be desirable to leave some of dielectric material 16 as an implant-screening mask. Those portions of dielectric layer 26, STI structure 24, and dielectric layer 16 that do not underlie photoresist layer 114 are unprotected by photoresist layer 114.

An impurity material of N-type conductivity such as, for example, phosphorus, is implanted through openings 118 and 120 to form doped regions 106 and 108. By way of example, the N-type impurity material is implanted at a dose ranging from about $1 \times 10^{13}$ ions/cm$^2$ to about $5 \times 10^{14}$ ions/cm$^2$ and an implant energy ranging from about 150 KeV to about 300 KeV.

It should be understood that circuit elements are typically manufactured in silicon layer 18. Thus, for the sake of completeness circuit elements 40 and 42 are shown in FIGS. 5–8. Circuit elements 40 and 42 have been described with reference to FIG 1.

Figure 6:
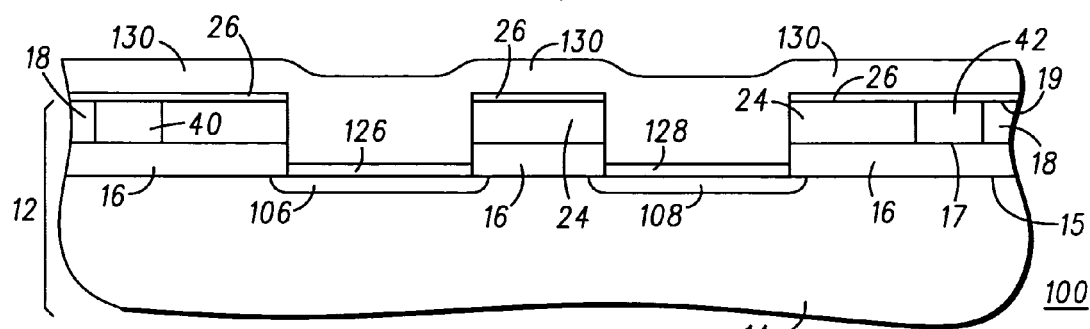
FIG. 6 is a cross-sectional side view of the semiconductor component of FIG. 5 at a later stage of manufacture.

Referring now to FIG. 6, photoresist layer 114 is removed using techniques known to those skilled in the art. Layers of dielectric material 126 and 128 are formed on the exposed portions of surface 15 in openings 118 and 120, respectively. By way of example, dielectric layers 126 and 128 are thermally grown oxide having a thickness ranging from about 10 Å to about 300 Å. Dielectric layers 126 and 128 serve as the dielectric material for portions of a plurality of capacitors of semiconductor component 100. The thicknesses of dielectric layers 126 and 128 are selected in accordance with the desired capacitance value. The material of dielectric layers 126 and 128 is not a limitation of the present invention. Other suitable materials include high dielectric constant dielectric materials, nitride, and an oxide-nitride-oxide dielectric stack. Although not shown, it should be understood that dielectric layers 126 and 128 can be formed as a conformal layer that lines the exposed portions of surface 15, sidewalls 119 and 121, and dielectric layer 26. Preferably, high dielectric constant materials such as, for example, nitride are formed as conformal layers. When dielectric layers 126 and 128 are formed from a conformal layer, those skilled in the art will recognize how to form the conformal layer and how to modify the subsequent processing steps in the formation of semiconductor component 100.

A layer of doped polycrystalline semiconductor material 130 is formed over dielectric layers 126 and 128 and dielectric layer 26. By way of example, doped polycrystalline semiconductor material 130 is doped polysilicon 130.

Figure 7:
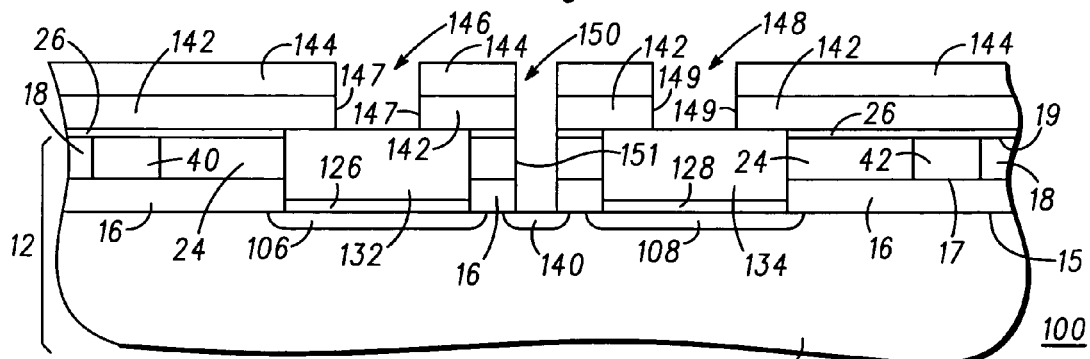
FIG. 7 is a cross-sectional side view of the semiconductor component of FIG. 6 at a later stage of manufacture.

Referring now to FIG. 7, doped polysilicon layer 130 is planarized using, for example, a CMP technique selective to dielectric layer 26. Thus, the planarization stops on dielectric layer 26. The remaining portions 132 and 134 of polysilicon layer 130 form portions of capacitor electrodes.

A layer of dielectric material 142 having a thickness ranging from about 50 Å to about 500 Å is formed on capacitor electrode portions 132 and 134 and on the exposed portions of dielectric layer 26. A layer of photoresist 144 is formed on dielectric layer 142 and patterned to have openings that expose the portions of dielectric layer 142 over capacitor electrodes 132 and 134 and portions of dielectric layer 142 between capacitor electrode portions 132 and 134. The exposed portions of dielectric material are etched using an anisotropic reactive ion etch to form openings 146, 148, and 150 having sidewalls 147, 149, and 151, respectively. The etch that forms openings 146 and 148 stops on and exposes capacitor electrode portions 132 and 134, respectively. The etch that forms opening 150 stops on and exposes a portion of surface 15 that is between capacitor electrode portions 132 and 134. Layer of photoresist 144 is removed. An impurity material of N-type conductivity such as, for example, phosphorus, is implanted through opening 150 to form a doped region 140 of N-type conductivity. By way of example, the N-type impurity material is implanted at a dose ranging from about $1 \times 10^{15}$ ions/cm$^2$ to about $5 \times 10^{15}$ ions/cm$^2$ and an implant energy ranging from about 20 KeV to about 50 KeV. Although the implant further dopes capacitor electrode portions 132 and 134, the additional doping has not been shown for the sake of clarity. Alternatively, a layer of photoresist may be formed on dielectric layer 142 and patterned to re-open opening 150, but not openings 146 and 148. In this case, capacitor electrode portions 132 and 134 are not further doped.

Figure 8:
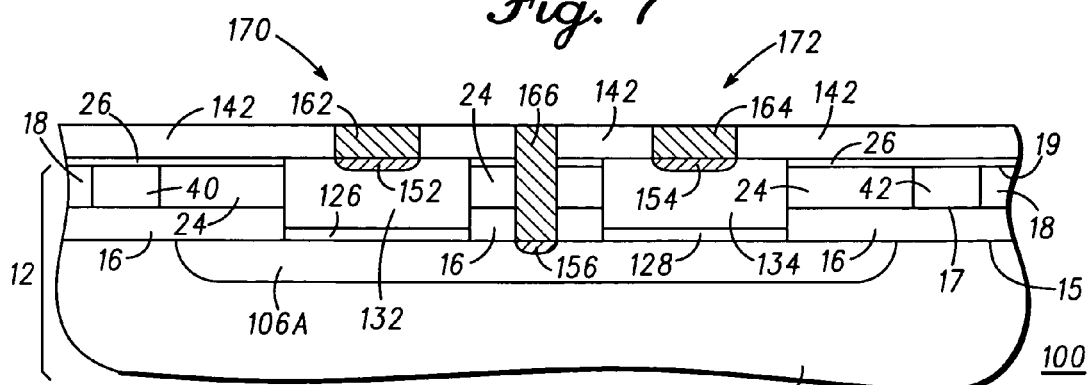
FIG. 8 is a cross-sectional side view of the semiconductor component of FIG. 7 at a later stage of manufacture.

Referring now to FIG. 8, the photoresist layer is removed and semiconductor component 100 is annealed by heating to a temperature ranging from about 800° C. to about 1,100° C. Annealing semiconductor component 100 causes the dopant in doped regions 106, 108, and 140 to diffuse laterally and vertically. Preferably, doped regions 106, 108, and 140 merge to form a single doped region 106A. It is preferable that doped regions 106, 108, and 140 merge, however, this is not a limitation of the present invention. Although it is preferable that doped regions 106, 108, and 140 merge, it may be that two or more of the doped regions do not merge. Doped regions 106, 108, and 140 may not extend the same depth into silicon layer 14. When doped regions 106, 108, and 140 do not extend the same depth into silicon layer 14, doped region 106A will not have the uniform thickness shown in FIG. 8.

A layer of refractory metal (not shown) is conformally deposited over capacitor electrode portions 132 and 134, doped region 106A, and dielectric layer 142. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 152 is formed from capacitor electrode portion 132, a nickel silicide layer 154 is formed from capacitor electrode portion 134, and a nickel silicide layer 156 is formed from doped region 106A. Portions of the nickel over dielectric layer 142 and within openings 146, 148, and 150 remain unreacted. After formation of the nickel silicide layers, any unreacted nickel is removed, which re-opens openings 146, 148, and 150. The type of silicide is not a limitation of the present invention. For example, other suitable silicides include titanium silicide (TiSi), platinum silicide (PtSi), cobalt silicide ($CoSi_2$), or the like. As those skilled in the art are aware, silicon is consumed during the formation of silicide and the amount of silicon consumed is a function of the type of silicide being formed.

Dielectric layer 142 is an optional layer that may prevent formation of silicide from silicon layer 18. It is included in those applications in which it is desirable to prevent silicide formation from silicon layer 18 while forming silicide from silicon layer 14. Dielectric layer 142 is not included in those applications in which it is desirable to form silicide from silicon layer 18 while forming silicide from silicon layer 14.

A layer of electrically conductive material (not shown) is formed in openings 146, 148, and 150 and on dielectric layer 142. The layer of electrically conductive material is planarized using, for example a CMP technique selective to dielectric layer 142. The planarization stops on dielectric layer 142 leaving electrically conductive plugs 162, 164, and 166. Doped region 106A, silicide layer 156, and conductive plug 166 cooperate to form an electrode of a capacitor 170 and capacitor electrode portion 132 cooperates with silicide layer 152 and conductive plug 162 to form the other electrode of capacitor 170. Dielectric material 126 serves as the dielectric material of capacitor 170. Similarly, doped region 106A, silicide layer 156, and conductive plug 166 cooperate to form an electrode of a capacitor 172 and capacitor electrode portion 134, silicide layer 154, and conductive plug 164 cooperate to form the other electrode of capacitor 172. Dielectric material 128 serves as the dielectric material of capacitor 172. The electrode formed from region 106A, silicide layer 156, and conductive plug 166 is common to capacitors 170 and 172.

It should be understood the type of material of conductive plugs 162, 164, and 166 is not a limitation of the present invention. Other suitable materials for conductive plugs 162, 164, and 166 include doped polysilicon, doped selective epitaxial semiconductor material, tantalum, titanium, tungsten, aluminum, silver, copper, or the like. It should be noted that when conductive plugs 162, 164, and 166 are copper, it may be desirable to form a barrier layer over sidewalls 147, 149, and 151 and dielectric layer 142 to prevent diffusion of copper within semiconductor component 100.

Figure 9:
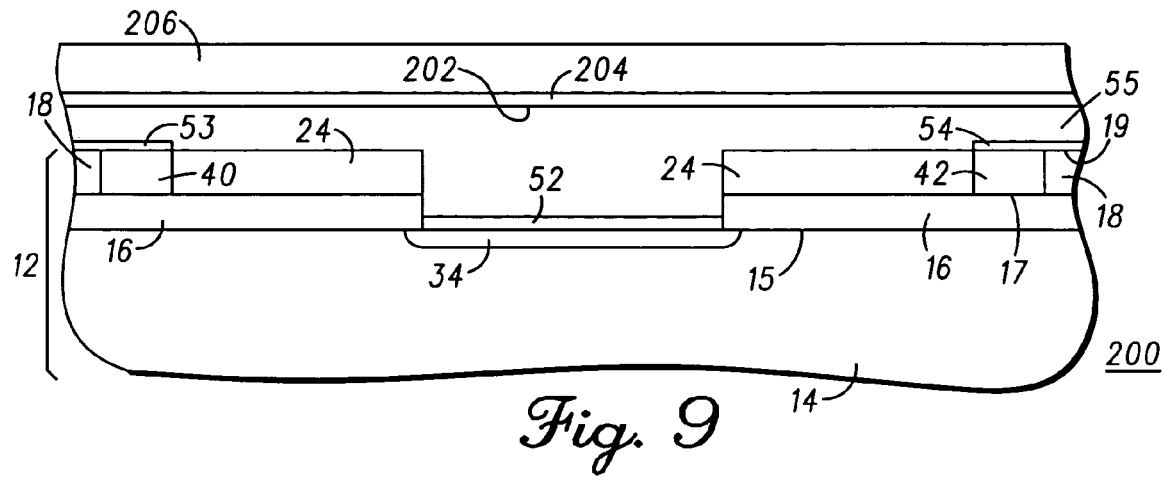
FIG. 9 is a cross-sectional side view of an SOI semiconductor component comprising a capacitor at a beginning stage of manufacture in accordance with another embodiment of the present invention.

FIG. 9 is a cross-sectional side view of a semiconductor component 200 comprising a capacitor at an intermediate stage of manufacture in accordance with another embodiment of the present invention. It should be understood that the beginning processing steps for manufacturing semiconductor component 200 are the same as those for manufacturing semiconductor component 10. Thus, the description of FIG. 9 continues from that of FIG. 1. Photoresist layer 27 and dielectric layer 26 are removed using techniques known to those skilled in the art. A layer of dielectric material 52 is formed on the exposed portions of surface 15, a layer of dielectric material 53 is formed on the portion of silicon layer 18 having circuit element 40, and a layer of dielectric material 54 is formed on the portion of silicon layer 18 having circuit element 42. By way of example, dielectric layers 52, 53, and 54 are thermally grown oxide having a thickness ranging from about 10 Å to about 300 Å. Dielectric layer 52 serves as the dielectric material for a capacitor of semiconductor component 200. Dielectric layers 53 and 54 may serve as the gate dielectric material for circuit elements 40 and 42, respectively. The thickness of dielectric layer 52 is selected in accordance with the desired capacitance value. The material of dielectric layers 52, 53, and 54 are not limitations of the present invention. Other suitable materials include high dielectric constant dielectric materials, nitride, and an oxide-nitride-oxide dielectric stack. Although not shown, it should be understood that dielectric layers 52, 53, and 54 can be formed as a conformal layer that lines the exposed portions of surface 15, sidewalls 32, and dielectric layer 26. Preferably, high dielectric constant materials such as, for example, nitride are formed as conformal layers. When dielectric layers 52, 53, and 54 are formed from a conformal layer, those skilled in the art will recognize how to form the conformal layer and how to modify the subsequent processing steps in the formation of semiconductor component 200.

A layer of doped polysilicon 55 is formed over dielectric layers 52, 53, and 54 and the exposed portions of STI structure 24 using techniques known to those skilled in the art.

Polysilicon layer 55 is planarized to have a surface 202 using, for example, a timed CMP planarization technique. In other words, polysilicon layer 55 is planarized for a predetermined amount of time. Preferably, polysilicon layer 55 is planarized to leave about 1,000 Å of polysilicon over the portion of dielectric layer 52 overlying STI structure 24. An optional Anti-Reflective Coating (ARC) layer 204 having a thickness ranging from about 50 Å to about 1,000 Å is formed on polysilicon surface 202. ARC layer 204 prevents light reflection from degrading photoresist layers during photolithography processes. Materials for ARC layer 204 are known to those skilled in the art. It should be understood that ARC layer 204 may also be a Bottom Anti-Reflective Coating (BARC) layer. A layer of photoresist 206 is formed on ARC layer 204 using techniques known to those skilled in the art.

Figure 10:
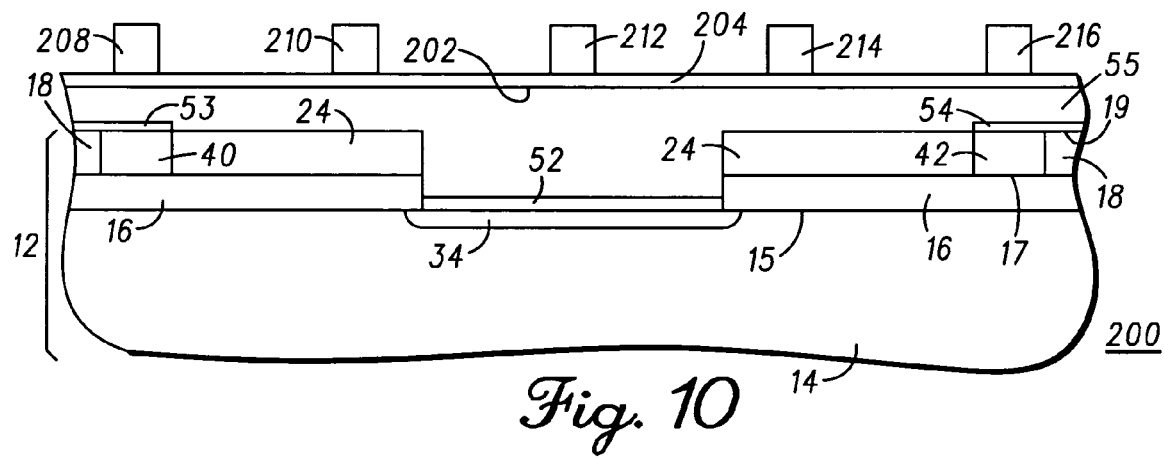
FIG. 10 is a cross-sectional side view of the semiconductor component of FIG. 9 at a later stage of manufacture.

Referring now to FIG. 10, photoresist layer 206 is patterned to form a plurality of masks 208, 210, 212, 214, and 216.

Figure 11:
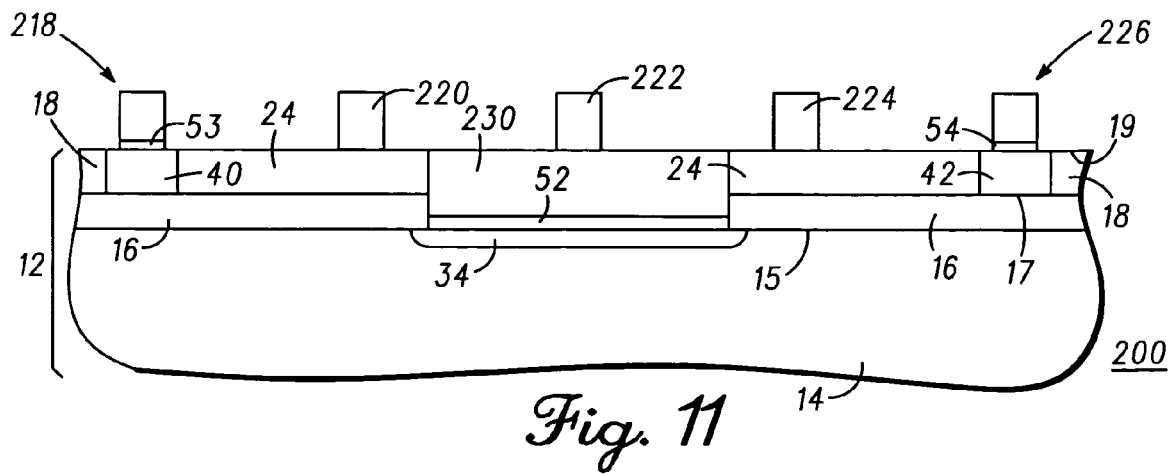
FIG. 11 is a cross-sectional side view of the semiconductor component of FIG. 10 at a later stage of manufacture.

Referring now to FIG. 11, the exposed portions of ARC layer 204 and polysilicon layer 55 are anisotropically etched using, for example, a reactive ion etch. The reactive ion etch stops or terminates on STI structures 24 thereby forming gate electrode structures 218 and 226 and dummy gates 220, 222, and 224. Gate electrode structure 218 comprises portions of dielectric layer 53 and polysilicon layer 55 and gate electrode structure 226 comprises portions of dielectric layer 54 and polysilicon layer 55. The respective portions of the dielectric material serve as the gate dielectric and the respective portions of the polysilicon serve as the gate conductor. In addition, the remaining portion 230 of polysilicon layer 55 serves as a capacitor electrode portion or plate of a capacitor. Gate structures 218 and 226 may be used as gates for circuit elements 40 and 42, respectively. Preferably masks 208–216 are equidistant from each other, i.e., have a constant mask pattern. The constant mask pattern reduces proximity effects associated with the photolithography steps used during the formation of gate electrode structures 218 and 226 and dummy gates 220–224. After formation of gate electrode structures 218 and 226 and dummy gates 220–224, masks 208–216 are removed and the remaining portions of ARC layer 204 are removed.

The number of gate electrode structures and dummy gates is not a limitation of the present invention. For example, it may be desirable to form gate electrode structures 218 and 226 but not dummy gates 220–224. In this case, photoresist layer 206 would be patterned to have only masks 208 and 216. The anisotropic reactive ion etch of polysilicon layer 55 forms gate electrode structures 218 and 226 but not dummy gates 220–224.

Figure 12:
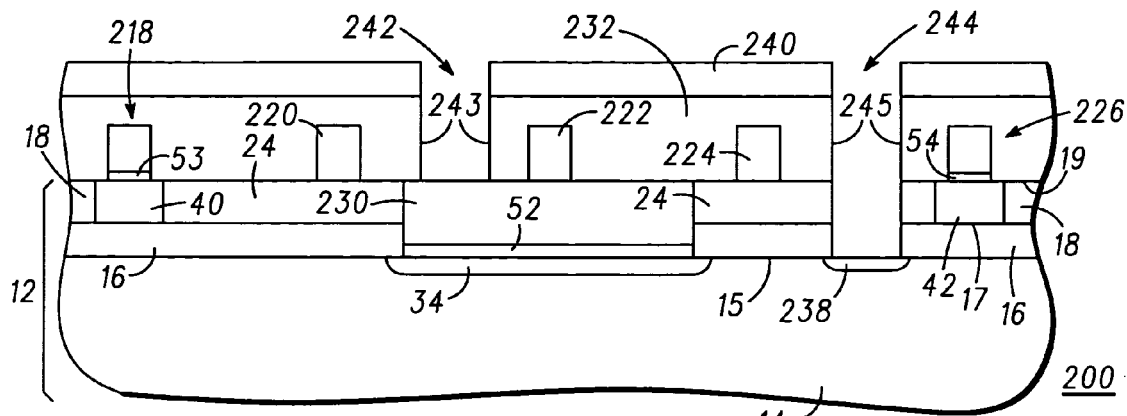
FIG. 12 is a cross-sectional side view of the semiconductor component of FIG. 11 at a later stage of manufacture.

Referring now to FIG. 12, a layer of dielectric material 232 having a thickness ranging from about 50 Å to about 500 Å is formed on capacitor electrode portion 230, silicon layer 18, circuit elements 40 and 42, gate electrode structures 218 and 226, dummy gates 220–224, and the remaining portions of STI structure 24. A layer of photoresist 240 is formed on dielectric material 232 and patterned to have openings that expose portions of dielectric material 232. The exposed portions of dielectric material 232 are etched using an anisotropic reactive ion etch to form openings 242 and 244 having sidewalls 243 and 245, respectively. The etch forming opening 242 stops on and exposes capacitor electrode portion 230. The etch forming opening 244 stops on and exposes silicon layer 14.

An impurity material of N-type conductivity such as, for example, phosphorus is implanted through opening 244 and into silicon layer 14 to form a doped region 238 of N-type conductivity. By way of example, the N-type impurity material is implanted at a dose ranging from about $1 \times 10^{15}$ ions/cm$^2$ to about $5 \times 10^{15}$ ions/cm$^2$ and an implant energy ranging from about 20 KeV to about 50 KeV. Although the implant further dopes capacitor electrode portion 230, the additional doping has not been shown for the sake of clarity. Alternatively, a layer of photoresist may be formed on dielectric layer 232 and patterned to re-open opening 244, but not opening 242. In this case, the implant forming doped region 238 does not further dope capacitor electrode portion 230.

Figure 13:
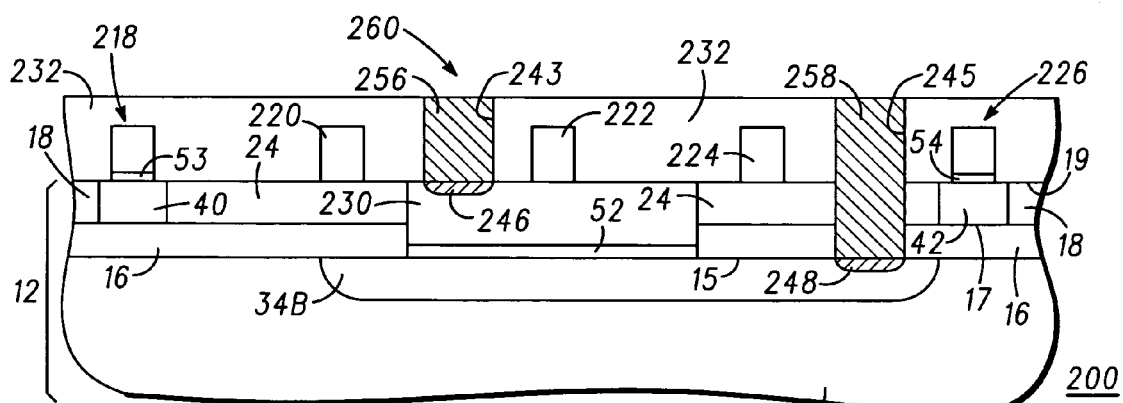
FIG. 13 is a cross-sectional side view of the semiconductor component of FIG. 12 at a later stage of manufacture.

Referring now to FIG. 13, the photoresist layer is removed and semiconductor component 200 is annealed by heating to a temperature ranging from about 800° C. to about 1,100° C. Annealing semiconductor component 200 causes the dopant in doped regions 34 and 238 to diffuse laterally and vertically. Preferably, doped regions 34 and 238 merge to form a single doped region 34B. However, they may or may not merge. Although doped regions 34 and 238 are shown as extending the same depth into silicon layer 14, this is not a limitation of the present invention. When doped regions 34 and 238 do not extend the same depth into silicon layer 14, doped region 34B will not have the uniform thickness shown in FIG. 13.

A layer of refractory metal (not shown) is conformally deposited over the exposed portions of capacitor electrode portion 230, doped region 34B, and dielectric layer 232. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 246 is formed from capacitor electrode portion 230 and a nickel silicide layer 248 is formed from doped region 34B. Portions of the nickel over dielectric layer 232 and within openings 242 and 244 remain unreacted. After formation of the nickel silicide layers, any unreacted nickel is removed, thereby re-opening openings 242 and 244. It should be understood that the type of silicide is not a limitation of the present invention. Other suitable silicides have been described with reference to FIGS. 4 and 8.

It should be noted that dielectric layer 232 is an optional layer that prevents formation of silicide from silicon layer 18. It is included in those applications in which it is desirable to prevent silicide formation from silicon layer 18 while forming silicide from silicon layer 14. Dielectric layer 232 is not included in those applications in which it is desirable to form silicide from silicon layer 18 while forming silicide from silicon layer 14.

A layer of electrically conductive material (not shown) is formed in openings 242 and 244 and on dielectric layer 232. The layer of electrically conductive material is planarized using, for example a CMP technique selective to dielectric layer 232. Thus, the planarization stops on dielectric layer 232 leaving electrically conductive plugs 256 and 258. Doped region 34B, silicide region 248, and conductive plug 258 cooperate to form one plate of a capacitor 260 and capacitor electrode portion 230, silicide region 246, and conductive plug 256 cooperate to form the other plate of capacitor 260. Dielectric material 52 serves as the dielectric material of capacitor 260.

It should be understood the type of material for conductive plugs 256 and 258 is not a limitation of the present invention. Other suitable materials for conductive plugs 256 and 258 include doped polysilicon, selective epitaxial silicon, tantalum, titanium, tungsten, aluminum, silver, copper, or the like. It should be noted that when conductive plugs 256 and 258 are copper, it may be desirable to form a barrier layer over sidewalls 243 and 245 and on dielectric layer 232 to prevent diffusion of copper within semiconductor component 200.

Figure 14:
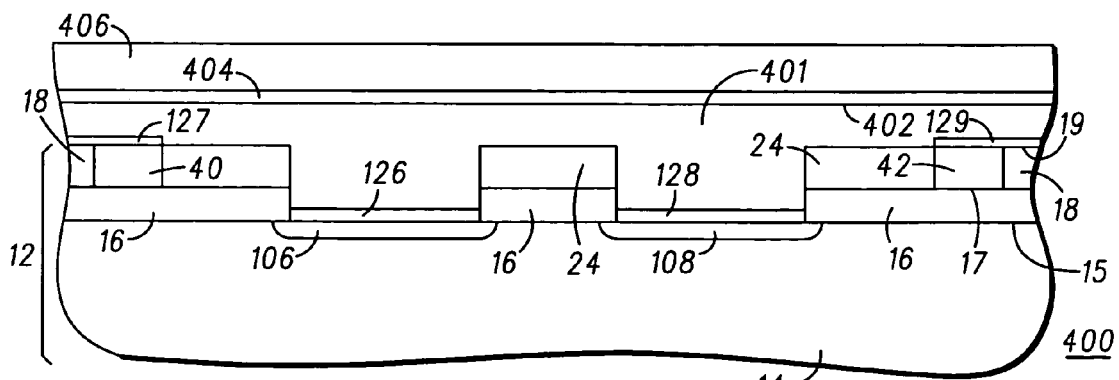
FIG. 14 is a cross-sectional side view of an SOI semiconductor component comprising a capacitor at a beginning stage of manufacture in accordance with another embodiment of the present invention.

FIG. 14 is a cross-sectional side view of a semiconductor component 400 comprising a capacitor at an intermediate stage of manufacture in accordance with another embodiment of the present invention. It should be understood that the beginning processing steps for manufacturing semiconductor component 400 are the same as those for manufacturing semiconductor component 100 and that the description of FIG. 14 continues from the description of FIG. 5. Photoresist layer 114 and dielectric layer 26 are removed using techniques known to those skilled in the art. Layers of dielectric material 126 and 128 are formed on the exposed portions surface 15 in openings 118 and 120, respectively. Layers of dielectric material 127 and 129 are formed on the portions of silicon layer 18 having circuit elements 40 and 42. By way of example, dielectric layers 126, 128, 127, and 129 are thermally grown oxide having a thickness ranging from about 10 Å to about 300 Å. Dielectric layers 126 and 128 serve as the dielectric material for portions of capacitors of semiconductor component 400. The thicknesses of dielectric layers 126 and 128 are selected in accordance with the desired capacitance values. Portions of dielectric layers 127 and 129 may serve as the gate dielectric material for portions of circuit elements 40 and 42, respectively. The material of dielectric layers 126, 128, 127, and 129 is not a limitation of the present invention. Other suitable materials include high dielectric constant dielectric materials, nitride, and an oxide-nitride-oxide dielectric stack. Although not shown, it should be understood that dielectric layers 126, 128, 127, and 129 can be formed as a conformal layer that lines the exposed portions of surface 15, sidewalls 119 and 121, and dielectric layer 26. Preferably, high dielectric constant materials such as, for example, nitride are formed as conformal layers. When dielectric layers 126, 128, 127, and 129 are formed from a conformal layer, those skilled in the art will recognize how to form the conformal layer and how to modify the subsequent processing steps in the formation of semiconductor component 400.

A layer of doped polycrystalline semiconductor material 401 is formed over dielectric layers 126, 128, 127, and 129, and STI structure 24. By way of example, doped polycrystalline semiconductor material 401 is doped polysilicon.

Polysilicon layer 401 is planarized to have a surface 402 using, for example, a timed CMP technique. In other words, polysilicon layer 401 is planarized for a predetermined amount of time. Preferably, polysilicon layer 401 is planarized to leave about 1,000 Å of polysilicon over the portions of STI structure 24 that are adjacent filled openings 118 and 120. An optional Anti-Reflective Coating (ARC) layer 404 having a thickness ranging from about 50 Å to about 1,000 Å is formed on polysilicon surface 402. ARC layer 404 prevents light reflection from degrading photoresist layers during photolithography processes. Materials for ARC layer 404 are known to those skilled in the art. It should be understood that ARC layer 404 may also be a Bottom Anti-reflective Coating (BARC) layer. A layer of photoresist 406 is formed on ARC layer 404 using techniques known to those skilled in the art.

Figure 15:
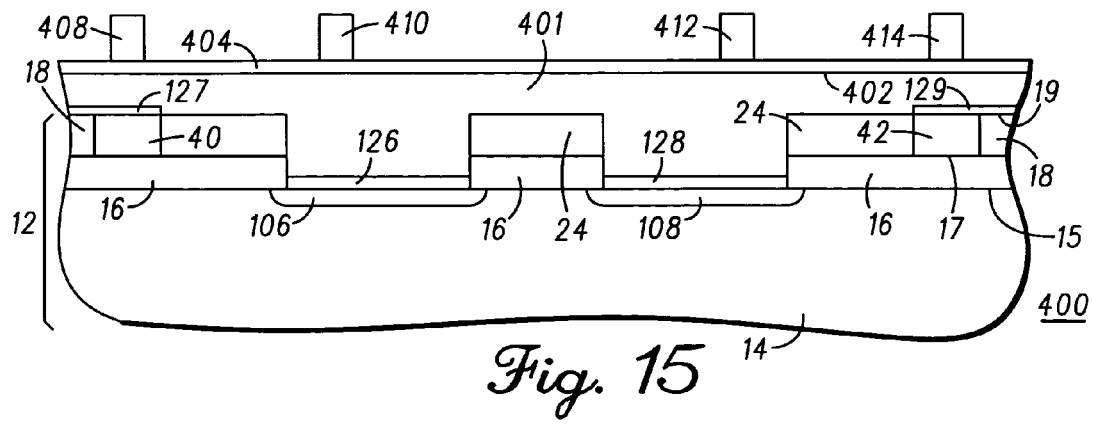
FIG. 15 is a cross-sectional side view of the semiconductor component of FIG. 14 at a later stage of manufacture.

Referring now to FIG. 15, photoresist layer 406 is patterned to form a plurality of masks 408, 410, 412, and 414.

Figure 16:
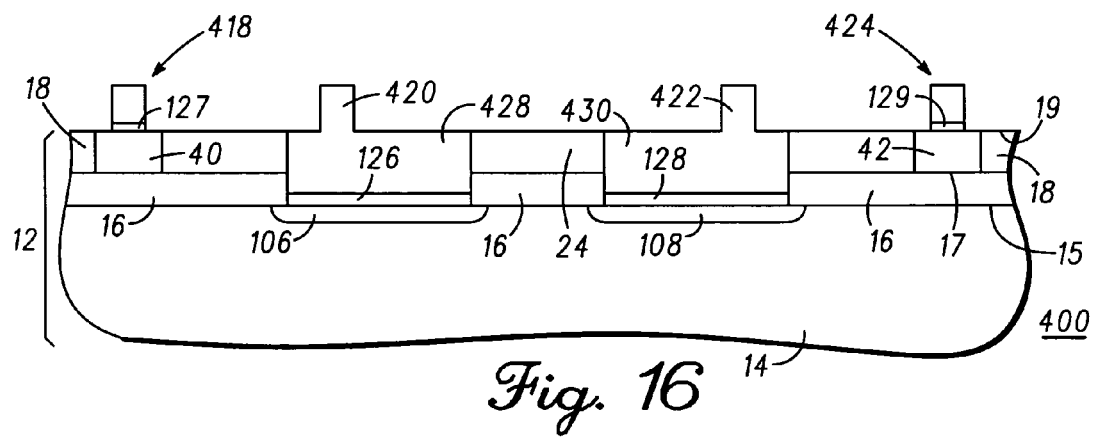
FIG. 16 is a cross-sectional side view of the semiconductor component of FIG. 15 at a later stage of manufacture.

Referring now to FIG. 16, the portions of ARC layer 404 and polysilicon layer 401 are anisotropically etched using, for example, a reactive ion etch. The reactive ion etch stops or terminates on STI isolation structure 24 thereby forming gate electrode structures 418 and 424 and dummy gates 420 and 422. Gate electrode structure 418 comprises a portion of dielectric layer 127 and polysilicon layer 401 and gate electrode structure 424 comprises a portion of dielectric layer 129 and polysilicon layer 401. The portions of the dielectric material 127 and 129 serve as the gate dielectrics of gate electrode structures 418 and 424 and the portions of polysilicon layer 401 serve as the gate conductors of gate structures 418 and 424. In addition, the remaining portions 428 and 430 of polysilicon layer 401 serve as portions of capacitors in accordance with this embodiment of the present invention. Gate electrode structures 418 and 424 may be used as gates for circuit elements 40 and 42, respectively. Preferably, the distance between masks 408 and 410 is the same as the distance between masks 412 and 414. This reduces proximity effects associated with the photolithography steps during the formation of gate electrode structures 418 and 424 and dummy gates 420 and 422. After formation of gate electrode structures 418–424, masks 408–414 and the remaining portions of ARC layer 404 are removed.

It should be further understood that the number of gate electrode structures and dummy gates is not a limitation of the present invention. For example, it may be desirable to form gate electrode structures 418 and 424 but not dummy gates 420 and 424. In this case, photoresist layer 406 would be patterned to have only masks 408 and 414. Thus, during the anisotropic etching of polysilicon layer 401 gate electrode structures 418 and 424 are formed but not dummy gates 420 and 422.

Figure 17:
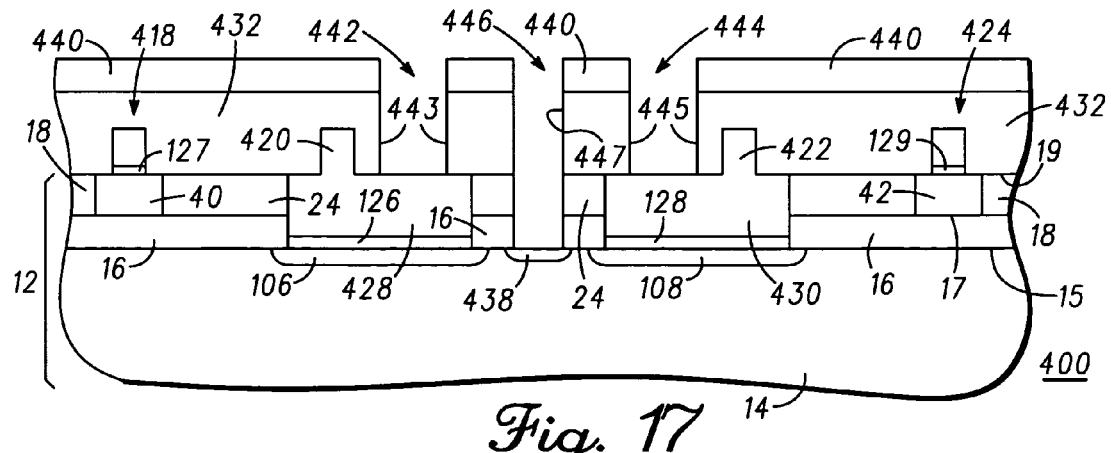
FIG. 17 is a cross-sectional side view of the semiconductor component of FIG. 16 at a later stage of manufacture.

Referring now to FIG. 17, a layer of dielectric material 432 having a thickness ranging from about 50 Å to about 500 Å is formed on capacitor electrode portions 428 and 430, silicon layer 18, circuit elements 40 and 42, gate electrode structures 418 and 424, dummy gates 420 and 422 and the remaining portions of STI structure 24. A layer of photoresist 440 is formed on dielectric layer 432 and patterned to have openings that expose the portions of dielectric layer 432 over capacitor electrode portions 428 and 430 and STI structure 24, respectively. The exposed portions of dielectric layer 432 are etched using an anisotropic reactive ion etch to form openings 442, 444, and 446 having sidewalls 443, 445, and 447, respectively. The etch forming openings 442 and 444 stops on and exposes portions of capacitor electrodes 428 and 430, respectively. The etch forming opening 446 stops on and exposes a portion of silicon layer 14. An impurity material of N-type conductivity such as, for example, phosphorus, is implanted through opening 446 to form a doped region 438. By way of example, the N-type impurity material is implanted at a dose ranging from about $1\times10^{15}$ ions/cm$^2$ to about $5\times10^{15}$ ions/cm$^2$ and an implant energy ranging from about 20 KeV to about 50 KeV. Although the implant further dopes capacitor electrode portions 428 and 430, the additional doping has not been shown for the sake of clarity. Alternatively, a layer of photoresist may be formed on dielectric layer 432 and patterned to re-open opening 446, but not openings 442 and 444. In this case, capacitor electrode portions 428 and 430 are not further doped.

Figure 18:
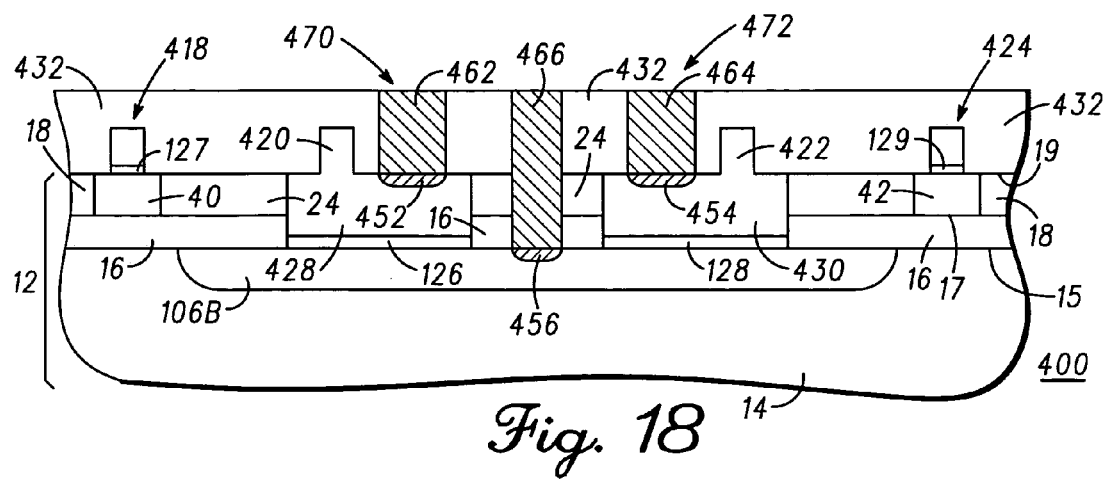
FIG. 18 is a cross-sectional side view of the semiconductor component of FIG. 17 at a later stage of manufacture.

Referring now to FIG. 18, the photoresist layer is removed and semiconductor component 400 is annealed by heating to a temperature ranging from about 800° C. to about 1,100° C. Annealing semiconductor component 400 causes the dopant in doped regions 106, 108, and 438 to diffuse laterally and vertically. Preferably, doped regions 106, 108, and 438 merge to form a single doped region 106B. Although it is preferable that doped regions 106, 108, and 438 merge, this is not a limitation of the present invention. In other words, none of the regions may merge or two of the regions may merge. Although doped regions 106, 108, and 438 are shown as extending the same depth into silicon layer 14, this is not a limitation of the present invention. When doped regions 106, 108, and 438 do not extend the same depth into silicon layer 14, doped region 106B will not have the uniform thickness shown in FIG. 18.

A layer of refractory metal (not shown) is conformally deposited over the exposed portions of capacitor electrodes 428 and 430, doped region 438, and dielectric layer 432. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 452 is formed from capacitor electrode portion 428, a nickel silicide layer 454 is formed from capacitor electrode portion 430, and a nickel silicide layer 456 is formed from doped region 106B. Portions of the nickel over dielectric layer 432 and within openings 442, 444, and 446 remain unreacted. After formation of the nickel silicide layers, any unreacted nickel is removed, which re-opens openings 442, 444, and 446. It should be understood that the type of silicide is not a limitation of the present invention. For example, other suitable silicides include titanium silicide (TiSi), platinum silicide (PtSi), cobalt silicide (CoSi$_2$), or the like.

Dielectric layer 432 is an optional layer that prevents formation of silicide from silicon layer 18. It is included in those applications in which it is desirable to prevent silicide formation from silicon layer 18 while forming silicide from silicon layer 14. Dielectric layer 432 is not included in those applications in which it is desirable to form silicide from silicon layer 18 while forming silicide from silicon layer 14. A layer of electrically conductive material (not shown) is formed in openings 442, 444, and 446 and on dielectric layer 432. The layer of electrically conductive material is planarized using, for example, a CMP technique selective to dielectric layer 432. The planarization stops on dielectric layer 432 leaving electrically conductive plugs 462, 464, and 466 filling openings 442, 444, and 446, respectively. Doped region 106B, silicide region 456, and conductive plug 466 cooperate to form one plate of a capacitor 470 and capacitor electrode portion 428, silicide region 452, and conductive plug 462 cooperate to form the other plate of capacitor 470. Dielectric material 126 serves as the dielectric material of capacitor 470. Similarly, doped region 106B, silicide region 456, and conductive plug 466 cooperate to form one plate of capacitor a 472 and capacitor electrode portion 430, silicide region 454, and conductive plug 464 cooperate to form the other plate of capacitor 472. Dielectric material 128 serves as the dielectric material of capacitor 472. In accordance with this embodiment, doped region 106B, silicide region 456, and conductive plug 466 form a capacitor electrode that is common to capacitors 470 and 472.

It should be understood the type of material of conductive plugs 462, 464, and 466 is not a limitation of the present invention. Other suitable materials for conductive plugs 462, 464, and 466 include doped polysilicon, doped epitaxial silicon, tantalum, titanium, tungsten, aluminum, silver, copper, or the like. It should be noted that when the electrically conductive material of plugs 462, 464, and 466 is copper, it may be desirable to form a barrier layer over sidewalls 443, 445, and 447 and on dielectric layer 432 to prevent diffusion of copper within semiconductor component 400.

Figure 19:
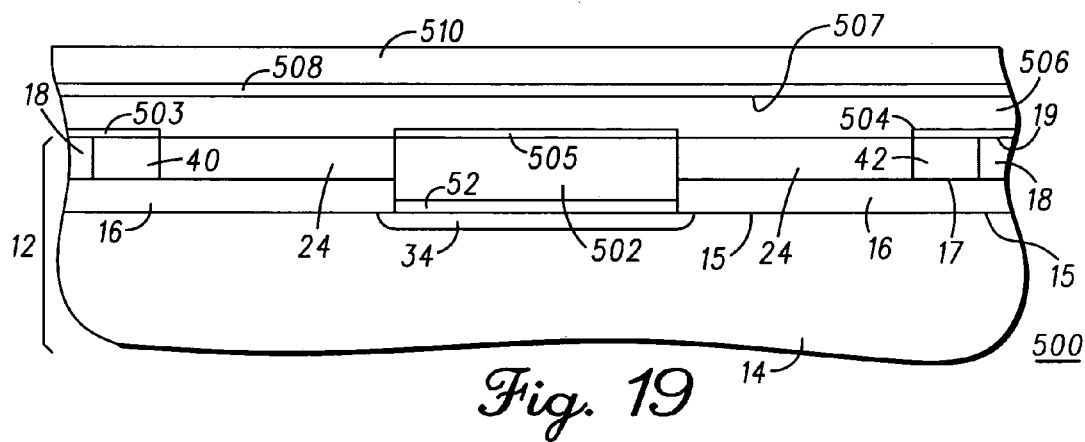
FIG. 19 is a cross-sectional side view of an SOI semiconductor component comprising a capacitor at a beginning stage of manufacture in accordance with another embodiment of the present invention.

FIG. 19 is a cross-sectional side view of a semiconductor component 500 comprising a capacitor at an intermediate stage of manufacture in accordance with another embodiment of the present invention. In this embodiment, two layers of polysilicon are formed over each other. An advantage of using two layers of polysilicon is that it allows decoupling the portions of the polysilicon forming the gate electrodes from that used to form the heavily doped capacitor electrode portion. It should be understood that the beginning processing steps for manufacturing semiconductor component 500 are the same as those for manufacturing semiconductor component 10. Thus, the description of FIG. 19 continues from that of FIG. 2. Polysilicon layer 55 is planarized using, for example, a CMP technique selective to dielectric layer 26. Thus, the planarization stops on dielectric layer 26. The CMP step is modified to remove dielectric layer 26, thereby exposing STI structure 24 and the portions of silicon layer 18 having circuit elements 40 and 42. The remaining portion of polysilicon layer 55 forms a portion 502 of a capacitor electrode.

A layer of dielectric material 505 is formed over portion 502 of polysilicon layer 55 and layers of dielectric material 503 and 504 are formed over the portions of silicon layer 18 having circuit elements 40 and 42, respectively. By way of example, dielectric layers 503, 504, and 505 are thermally grown oxide having a thickness ranging from about 10 Å to about 300 Å. Dielectric layers 503 and 504 may serve as the gate dielectric for circuit elements 40 and 42, respectively. The material of dielectric layers 503, 504, and 505 are not limitations of the present invention. Other suitable materials include high dielectric constant dielectric materials, nitride, and an oxide-nitride-oxide dielectric stack.

A layer of polysilicon 506 having a thickness ranging from about 500 Å to about 1,500 Å is formed on dielectric layers 503, 504, 505, and STI structure 24. Polysilicon layer 506 is planarized to have a surface 507 using, for example, a timed CMP planarization technique. Preferably, polysilicon layer 506 is planarized to leave about 1,000 Å of polysilicon over dielectric layers 503, 504, and 505. An optional ARC layer 508 having a thickness ranging from about 50 Å to about 500 Å is formed on polysilicon surface 507. ARC layer 508 prevents light reflection from degrading photoresist layers during photolithography processes. Materials for ARC layer 508 are known to those skilled in the art. It should be understood that ARC layer 508 may also be a Bottom Anti-reflective Coating (BARC) layer. A layer of photoresist 510 is formed on ARC layer 508 using techniques known to those skilled in the art.

Figure 20:
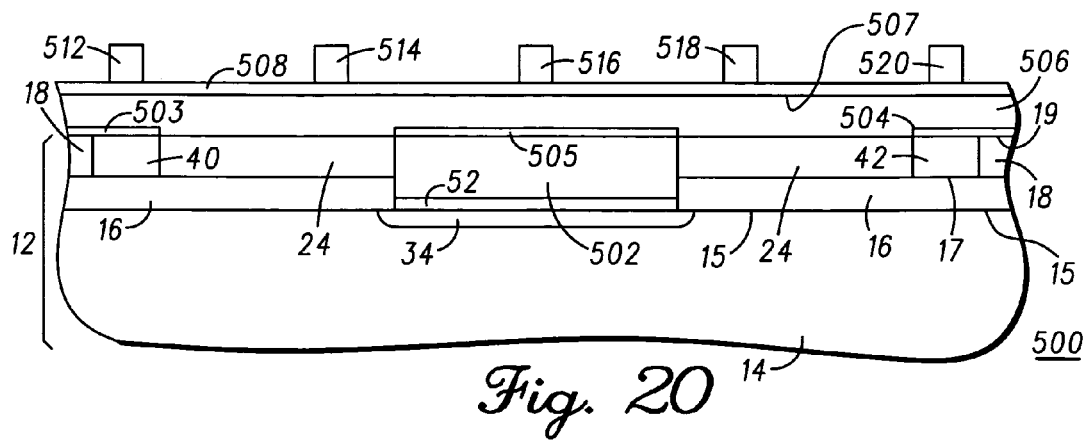
FIG. 20 is a cross-sectional side view of the semiconductor component of FIG. 19 at a later stage of manufacture.

Referring now to FIG. 20, photoresist layer 510 is patterned to form a plurality of masks 512, 514, 516, 518, and 520.

Figure 21:
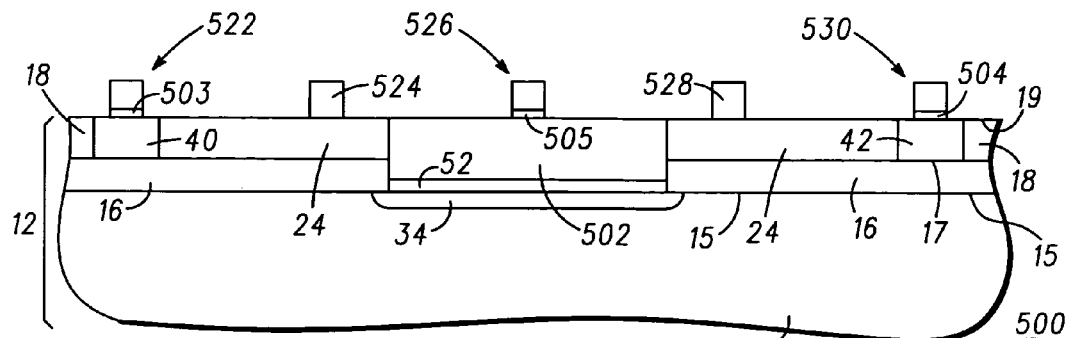
FIG. 21 is a cross-sectional side view of the semiconductor component of FIG. 20 at a later stage of manufacture.

Referring now to FIG. 21, the exposed portions of ARC layer 508 and polysilicon layer 506 are anisotropically etched using, for example, a reactive ion etch. The reactive ion etch stops or terminates on STI structure 24 thereby forming gate electrode structures 522 and 530. Gate electrode structure 522 comprises a portion of dielectric layer 503 and a portion of polysilicon layer 506 and gate electrode structure 530 comprises a portion of dielectric layer 504 and a portion of polysilicon layer 506. The portions of the dielectric material serve as the gate dielectric material and the portions of the polysilicon serve as the gate conductors. Gate electrode structures 522 and 530 may be used as gates for circuit elements 40 and 42, respectively. Gate structures 524–528 serve as dummy gates. It should be understood that masks 512–520 are preferably formed to be equidistant from each other to reduce proximity effects associated with the photolithography steps during the formation of gate electrode structures 522 and 530 and dummy gates 524–528. After formation of gate electrode structures 522 and 530 and dummy gates 522–528, masks 512–520 are removed and the remaining portions of ARC layer 508 are removed.

The number of gate electrode structures is not a limitation of the present invention. For example, it may be desirable to form gate electrode structures 522 and 530 but not dummy gates 524–528. In this case, photoresist layer 510 would be patterned to have only masks 512 and 520. Thus, during the anisotropic reactive ion etch of polysilicon layer 504 gate electrode structures 522 and 530 are formed but not dummy gates 524–528.

Figure 22:
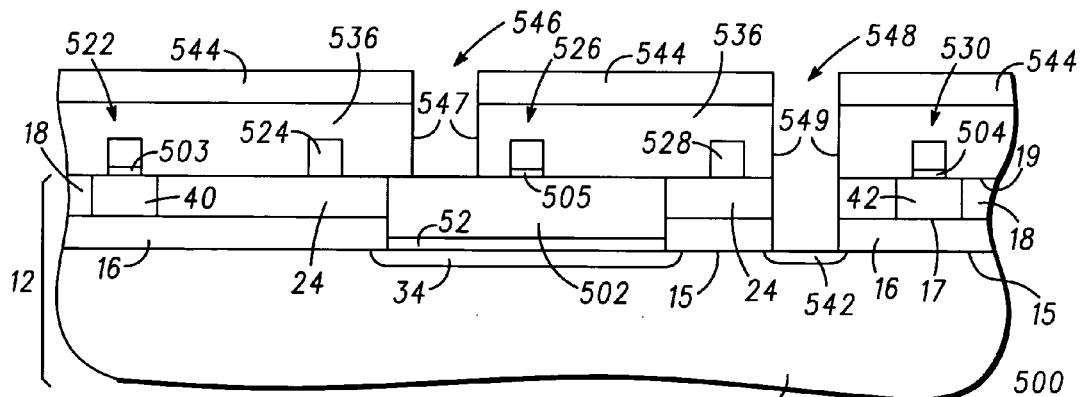
FIG. 22 is a cross-sectional side view of the semiconductor component of FIG. 21 at a later stage of manufacture.

Referring now to FIG. 22, a layer of dielectric material 536 having a thickness ranging from about 50 Å to about 500 Å is formed on capacitor electrode portion 502, silicon layer 18, circuit elements 40 and 42, gate electrode structures 522 and 530, dummy gates 524–528, and the remaining portions of STI structure 24. A layer of photoresist 544 is formed on dielectric material 536 and patterned to have openings that expose portions of dielectric material 536. The exposed portions of dielectric material 536 are etched using an anisotropic reactive ion etch to form openings 546 and 548 having sidewalls 547 and 549, respectively. The etch forming opening 546 stops on and exposes capacitor electrode portion 502. The etch forming opening 548 stops on and exposes a portion of silicon layer 14. An impurity material of N-type conductivity such as, for example, phosphorus is implanted through opening 548 and into silicon layer 14 to form a doped region 542. By way of example, the N-type impurity material is implanted at a dose ranging from about $1 \times 10^{15}$ ions/cm$^2$ to about $5 \times 10^{15}$ ions/cm$^2$ and an implant energy ranging from about 20 KeV to about 50 KeV. Although the implant further dopes capacitor electrode portion 502, the additional doping has not been shown for the sake of clarity. Alternatively, a layer of photoresist may be formed on dielectric layer 536 and patterned to re-open opening 548, but not opening 546. In this case, capacitor electrode portion 56 is not further doped.

Figure 23:
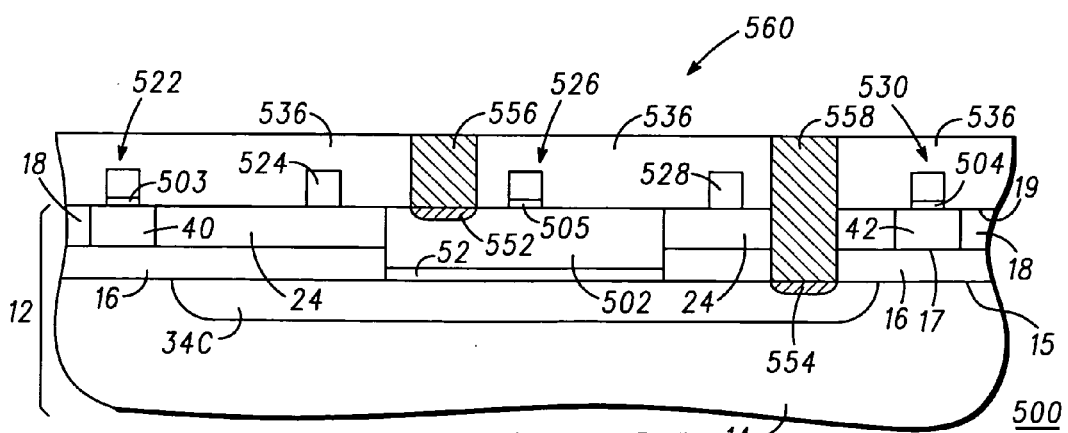
FIG. 23 is a cross-sectional side view of the semiconductor component of FIG. 22 at a later stage of manufacture.

Referring now to FIG. 23, the photoresist layer is removed and semiconductor component 500 is annealed by heating to a temperature ranging from about 800° C. to about 1,100° C. Annealing semiconductor component 500 causes the dopant in doped regions 34 and 542 to diffuse laterally and vertically. Preferably, doped regions 34 and 542 merge to form a single doped region 34C. Although it is preferable that doped regions 34 and 542 merge, this is not a limitation of the present invention. In other words, the regions may not merge. Although doped regions 34 and 542 are shown as extending the same depth into silicon layer 14, this is also not a limitation of the present invention. When doped regions 34 and 542 do not extend the same depth into silicon layer 14, doped region 34C will not have the uniform thickness shown in FIG. 23.

A layer of refractory metal (not shown) is conformally deposited over the exposed portions of capacitor electrode portion 502, doped region 34C, and dielectric layer 536. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 552 is formed from capacitor electrode portion 502 and a nickel silicide layer 554 is formed from doped region 34C. Portions of the nickel over dielectric layer 536 and within openings 546 and 548 remain unreacted. After formation of the nickel silicide layers, any unreacted nickel is removed, which re-opens openings 546 and 548. The type of silicide is not a limitation of the present invention. Other suitable types of silicide have been described with reference to FIG. 4.

It should be noted that dielectric layer 536 is an optional layer that prevents formation of silicide from silicon layer 18. It is included in those applications in which it is desirable to prevent silicide formation from silicon layer 18 while forming silicide from silicon layer 14. Dielectric layer 536 is not included in those applications in which it is desirable to form silicide from silicon layer 18 while forming silicide from silicon layer 14.

A layer of electrically conductive material (not shown) is formed in openings 546 and 548 and on dielectric layer 536. The layer of electrically conductive material is planarized using, for example a CMP technique selective to dielectric layer 536. Thus, the planarization stops on dielectric layer 536 leaving electrically conductive plugs 556 and 558. Doped region 34C, silicide region 554, and conductive plug 558 cooperate to form one plate of a capacitor 560 and capacitor electrode portion 502, silicide region 552, and conductive plug 556 cooperate to form the other plate of capacitor 560. Dielectric material 52 serves as the dielectric material of capacitor 560.

It should be understood the type of material for conductive plugs 556 and 558 is not a limitation of the present invention. Other suitable materials for conductive plugs 556 and 558 include doped polysilicon, selective epitaxial silicon, tantalum, titanium, tungsten, aluminum, silver, copper, or the like. When conductive plugs 556 and 558 are copper, it may be desirable to form a barrier layer over sidewalls 547 and 549 and on dielectric layer 536 to prevent diffusion of copper within semiconductor component 500.

Figure 24:
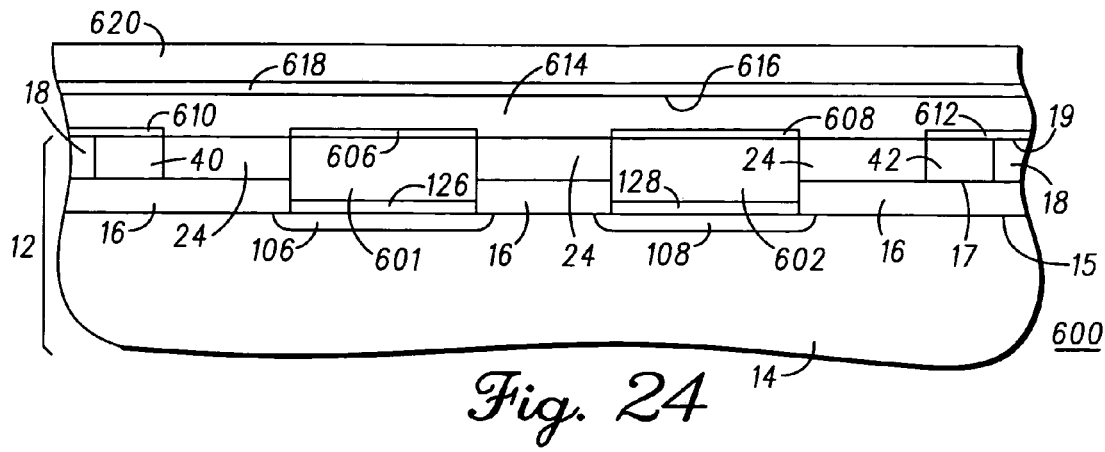
FIG. 24 is a cross-sectional side view of an SOI semiconductor component comprising a capacitor at an intermediate stage of manufacture in accordance with another embodiment of the present invention.

FIG. 24 is a cross-sectional side view of a semiconductor component 600 comprising a capacitor at an intermediate stage of manufacture in accordance with another embodiment of the present invention. It should be understood that the beginning processing steps for manufacturing semiconductor component 600 are the same as those for manufacturing semiconductor component 100 and that the description of FIG. 24 continues from the description of FIG. 6. Polysilicon layer 130 is planarized using, for example, a CMP technique selective to dielectric layer 26. Thus, the planarization stops on dielectric layer 26. The CMP step is modified to remove dielectric layer 26, thereby exposing STI structure 24 and the portions of silicon layer 18 having circuit elements 40 and 42. The remaining portion of polysilicon layer 130 forms a portion 601 of a capacitor electrode and a portion 602 of another capacitor electrode.

Layers of dielectric material 606 and 608 are formed over portions 601 and 602 of polysilicon layer 130, respectively, and layers of dielectric material 610 and 612 are formed over the respective regions of silicon layer 18 having circuit elements 40 and 42. By way of example, dielectric layers 606, 608, 610, and 612 are thermally grown oxide having a thickness ranging from about 10 Å to about 300 Å. Dielectric layers 610 and 612 may serve as the gate dielectric for circuit elements 40 and 42, respectively. The material of dielectric layers 606, 608, 610, and 612 are not limitations of the present invention. Other suitable materials include high dielectric constant dielectric materials, nitride, and an oxide-nitride-oxide dielectric stack. A layer of polysilicon 614 having a thickness ranging from about 500 Å to about 1,500 Å is formed on capacitor electrode portions 601 and 602, dielectric layers 606, 608, 610, and 612, and STI structure 24. Preferably, polysilicon layer 614 is intrinsic polysilicon or polysilicon that is less heavily doped than polysilicon layer 130 that forms capacitor electrode portions 601 and 602. Even more preferably, the dopant concentration of doped polysilicon layer 614 is at least ten times less than the dopant concentration of doped polysilicon layer 130. Polysilicon layer 614 is planarized to have a surface 616 using, for example, a timed CMP planarization technique. By way of example, polysilicon layer 614 is planarized to leave about 1,000 Å of polysilicon over dielectric layers 606, 608, 610, and 612. An optional ARC layer 618 having a thickness ranging from about 50 Å to about 500 Å is formed on polysilicon surface 616. It should be understood that ARC layer 610 may also be a Bottom Antireflective Coating (BARC) layer. A layer of photoresist 620 is formed on ARC layer 618 using techniques known to those skilled in the art.

Figure 25:
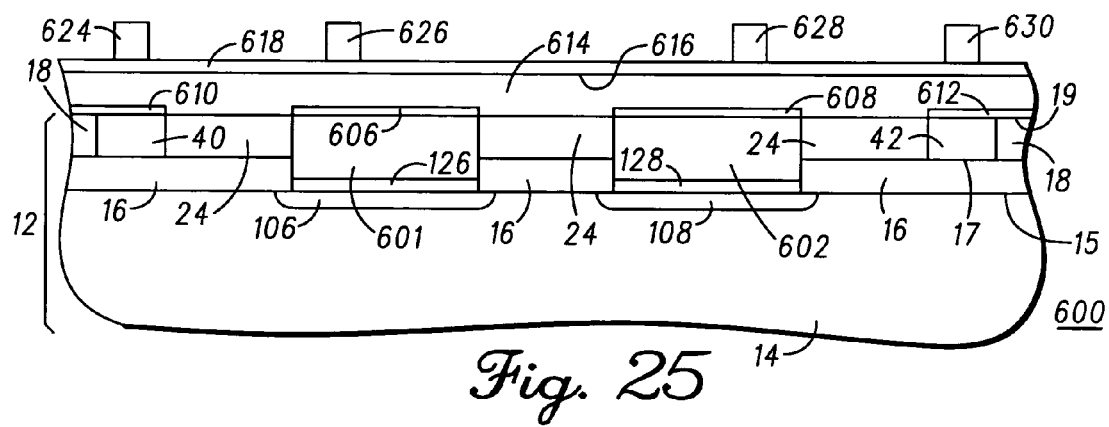
FIG. 25 is a cross-sectional side view of the semiconductor component of FIG. 24 at a later stage of manufacture.

Referring now to FIG. 25, photoresist layer 620 is patterned to form a plurality of masks 624, 626, 628, and 630.

Figure 26:
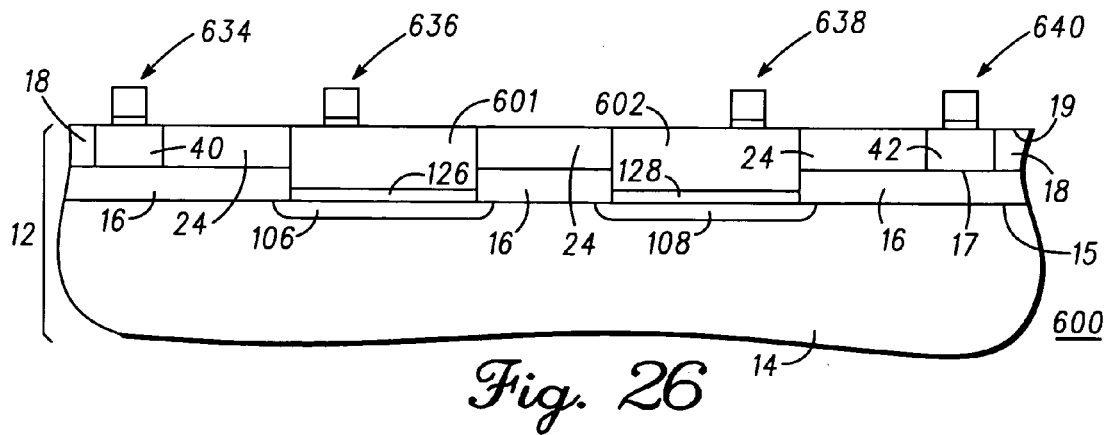
FIG. 26 is a cross-sectional side view of the semiconductor component of FIG. 25 at a later stage of manufacture.

Referring now to FIG. 26, the exposed portions of ARC layer 618 and polysilicon layer 614 are anisotropically etched using, for example, a reactive ion etch. The reactive ion etch stops or terminates on STI structure 24 thereby forming a plurality of gate electrode structures 634 and 640 and dummy gates 636 and 638. In addition, the remaining portions 601 and 602 of polysilicon layer 130 serve as portions of capacitor electrodes in accordance with this embodiment of the present invention. Gate electrode structures 634 and 640 may be used as gates for circuit elements 40 and 42, respectively. Preferably, the distance between masks 634 and 636 is the same as the distance between masks 638 and 640. This reduces proximity effects associated with the photolithography steps used during the formation of gate electrode structures 634 and 640 and dummy gates 636 and 638. After formation of gate electrode structures 634 and 640 and dummy gates 636 and 638, masks 624–630 and the remaining portions of ARC layer 618 are removed.

It should be further understood that the number of gate electrode structures and dummy gates is not a limitation of the present invention. For example, it may be desirable to form gate electrode structures 634 and 640 but not dummy gates 636 and 638. In this case, photoresist layer 614 would be patterned to have only masks 624 and 630. Thus, during the anisotropic etching of polysilicon layer 614 gate electrode structures 624 and 630 are formed but not dummy gates 626 and 628.

Figure 27:
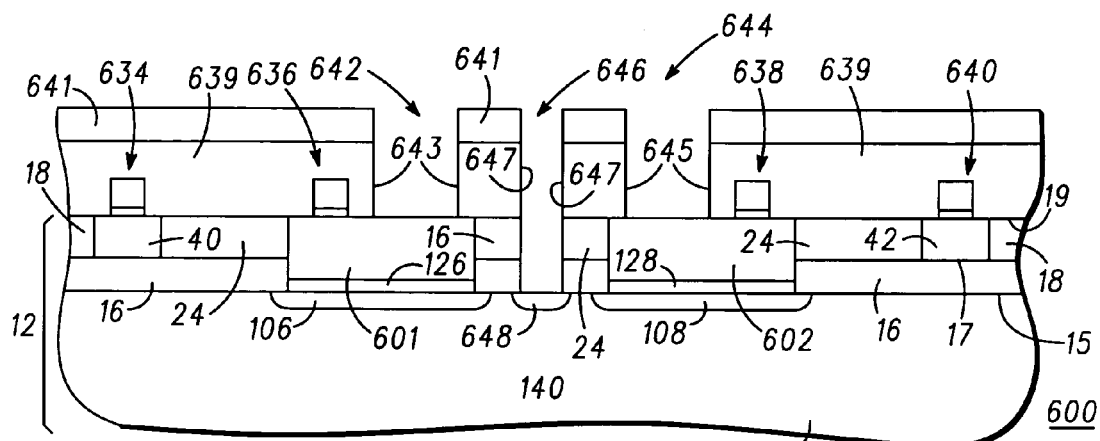
FIG. 27 is a cross-sectional side view of the semiconductor component of FIG. 26 at a later stage of manufacture.

Referring now to FIG. 27, a layer of dielectric material 639 having a thickness ranging from about 50 Å to about 500 Å is formed on capacitor electrode portions 601 and 602, silicon layer 18, circuit elements 40 and 42, gate electrode structures 634 and 640, dummy gates 636 and 638, and the remaining portions of STI structure 24. A layer of photoresist 641 is formed on dielectric layer 639 and patterned to have openings that expose the portions of dielectric layer 639 over capacitor electrode portions 601 and 602 and STI structure 24. The exposed portions of dielectric layer 639 are etched using an anisotropic reactive ion etch to form openings 642, 644, and 646 having sidewalls 643, 645, and 647, respectively. The etch forming openings 642 and 644 stops on and exposes portions of capacitor electrodes 602 and 604, respectively. The etch forming opening 646 stops on and exposes a portion of silicon layer 14. An impurity material of N-type conductivity such as, for example, phosphorus, is implanted through opening 646 to form a doped region 648. By way of example, the N-type impurity material is implanted at a dose ranging from about $1 \times 10^{15}$ ions/cm$^2$ to about $5 \times 10^{15}$ ions/cm$^2$ and an implant energy ranging from about 20 KeV to about 50 KeV. Although the implant further dopes capacitor electrode portions 601 and 602, the additional doping has not been shown for the sake of clarity. Alternatively, a layer of photoresist may be formed on dielectric layer 639 and patterned to re-open opening 646, but not openings 642 and 644. In this case, capacitor electrode portions 601 and 602 are not further doped.

Figure 28:
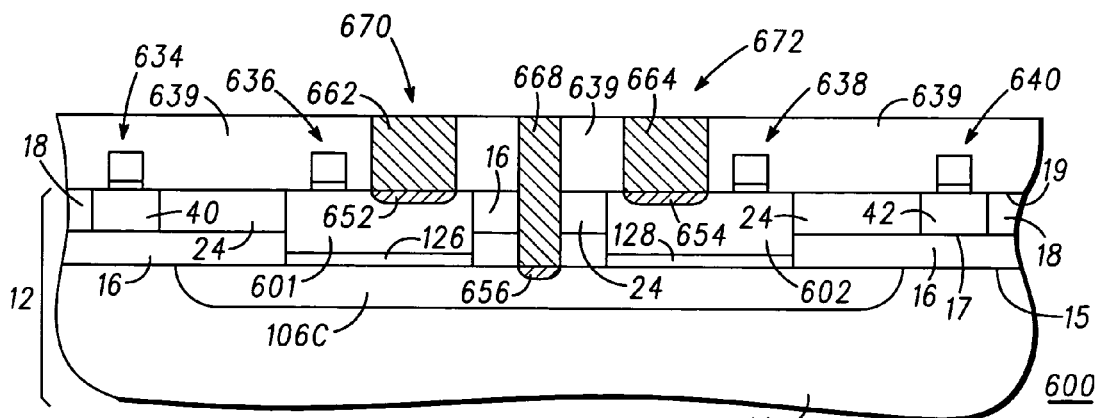
FIG. 28 is a cross-sectional side view of the semiconductor component of FIG. 27 at a later stage of manufacture.

Referring now to FIG. 28, the photoresist layer is removed and semiconductor component 600 is annealed by heating to a temperature ranging from about 800° C. to about 1,100° C. Annealing semiconductor component 600 causes the dopant in doped regions 106, 108, and 648 to diffuse laterally and vertically. Preferably, doped regions 106, 108, and 648 merge to form a single doped region 106C. Although it is preferable that doped regions 106, 108, and 648 merge, this is not a limitation of the present invention. In other words, none of the regions may merge or two of the regions may merge. Although doped regions 106, 108, and 648 are shown as extending the same depth into silicon layer 14, this is not a limitation of the present invention. When doped regions 106, 108, and 648 do not extend the same depth into silicon layer 14, doped region 106C will not have the uniform thickness shown in FIG. 28.

A layer of refractory metal (not shown) is conformally deposited over the exposed portions of capacitor electrode portions 601 and 602, doped region 106C, and dielectric layer 639. By way of example, the refractory metal is nickel having a thickness ranging from about 50 Å to about 150 Å. The refractory metal is heated to a temperature ranging from about 350° C. to about 500° C. The heat treatment causes the nickel to react with the silicon to form nickel silicide (NiSi) in all regions in which the nickel is in contact with silicon. Thus, a nickel silicide layer 652 is formed from capacitor electrode 601, a nickel silicide layer 654 is formed from capacitor electrode 602, and a nickel silicide layer 656 is formed from doped region 106C. Portions of the nickel over dielectric layer 639 and within openings 642, 644, and 646 remain unreacted. After formation of the nickel silicide layers, any unreacted nickel is removed, which re-opens openings 642, 644, and 646. It should be understood that the type of silicide is not a limitation of the present invention. Other suitable types of silicide have been described with reference to FIG. 4.

It should be noted that dielectric layer 639 is an optional layer that prevents formation of silicide from silicon layer 18. It is included in those applications in which it is desirable to prevent silicide formation from silicon layer 18 while forming silicide from silicon layer 14. Dielectric layer 639 is not included in those applications in which it is desirable to form silicide from silicon layer 18 while forming silicide from silicon layer 14.

A layer of electrically conductive material (not shown) is formed in openings 642, 644, and 646 and on dielectric layer 639. The layer of electrically conductive material is planarized using, for example a Chemical Mechanical Polishing (CMP) technique selective to dielectric layer 639. The planarization stops on dielectric layer 639 leaving electrically conductive plugs 662, 664, and 668 filling openings 642, 644, and 646, respectively. Doped region 106C, silicide region 656, and conductive plug 668 cooperate to form one plate of a capacitor 670 and capacitor electrode portion 601, silicide region 652, and conductive plug 662 cooperate to form the other plate of capacitor 670. Dielectric layer 126 serves as the dielectric material of capacitor 670. Similarly, doped region 106C, silicide region 656, and conductive plug 668 cooperate to form one plate of a capacitor 672 and capacitor electrode portion 602, silicide region 654, and conductive plug 664 cooperate to form the other plate of capacitor 672. Dielectric material 128 serves as the dielectric material of capacitor 672. Doped region 106C, silicide region 656, and conductive plug 668 are common to capacitors 670 and 672.

It should be understood the type of material of conductive plugs 662, 664, and 668 is not a limitation of the present invention. Other suitable materials for conductive plugs 662, 664, and 668 include doped polysilicon, doped selective epitaxial silicon, tantalum, titanium, tungsten, aluminum, silver, copper, or the like. When the electrically conductive material of plugs 662, 664, and 668 is copper, it may be desirable to form a barrier layer over sidewalls 643, 645, and 647 and on dielectric layer 639 to prevent diffusion of copper within semiconductor component 600.

By now it should be appreciated that a semiconductor component using both semiconductor layers of an SOI substrate for circuit elements and a method for its manufacture have been provided. In accordance with the present invention, an electrode or plate of a capacitor is formed from the handle wafer of an SOI substrate. The second or other plate and capacitor dielectric material are disposed over the first plate whereas other circuit elements are formed from the active wafer of the SOI substrate. An advantage of using both wafers or layers for manufacturing circuit elements is that processing steps optimized for the circuit elements used in signal processing can be decoupled from the processing steps used to form capacitors. In addition, the processing steps for manufacturing the circuits in the handle wafer can be integrated with the processing steps that are used to form the circuit elements in the active wafer or layer. An advantage of manufacturing a capacitor in accordance with the present invention is that it decreases the amount of semiconductor material used to manufacture the capacitor, thereby decreasing the cost of manufacturing semiconductor components.

Although certain preferred embodiments and methods have been disclosed herein, it will be apparent from the foregoing disclosure to those skilled in the art that variations and modifications of such embodiments and methods may be made without departing from the spirit and scope of the invention. For example, the conductivity type of the handle wafer and active wafer for capacitors manufactured in accordance with the present invention may be of N-type conductivity, P-type conductivity, or they may be intrinsic semiconductor material. In addition, the SOI substrate is not limited to being silicon but may be other materials such as, for example, a germanium active wafer coupled to a silicon handle wafer via a dielectric material, a gallium arsenide active wafer coupled to a silicon handle wafer via a dielectric material, an active wafer comprising diamond coupled to a silicon handle wafer via a dielectric material, or the like. Rather than forming the capacitor in an STI region, it can be formed in a region of silicon layer 18. If desired, contacts can be formed to the handle wafer for biasing it. It is intended that the invention shall be limited only to the extent required by the appended claims and the rules and principles of applicable law.

What is claimed is:

1. A method for manufacturing a semiconductor component, comprising:
    providing an SOI substrate comprising a first layer of semiconductor material having a first semiconductor surface, a first layer of dielectric material having a first dielectric surface, the first layer of dielectric material disposed on the first layer of semiconductor material, and a second layer of semiconductor material having a second semiconductor surface, the second layer of semiconductor material disposed on the first layer of dielectric material;
    forming an opening in the SOI substrate, the opening extending from the second semiconductor surface to the first semiconductor surface, wherein the opening exposes a portion of the first semiconductor surface and wherein the first semiconductor surface serves as an etch stop that substantially terminates formation of the opening;
    forming a first capacitor electrode from the first layer of semiconductor material;
    forming a capacitor dielectric layer on the portion of the first semiconductor surface exposed during the formation of the opening that substantially terminates on the first semiconductor surface; and
    forming a second capacitor electrode on the capacitor dielectric layer.

2. The method of claim 1, further including forming a circuit element in the second layer of semiconductor material.

3. The method of claim 2, wherein forming the first capacitor electrode includes forming a first doped region of a first conductivity type in a first portion of the first layer of semiconductor material.

4. The method of claim 3, wherein forming the first capacitor electrode includes implanting an impurity material of the first conductivity type into the first layer of semiconductor material at a dose ranging from about $1 \times 10^{13}$ ions per square centimeter (ions/cm$^2$) to about $5 \times 10^{14}$ ions/cm$^2$ and an implant energy ranging from about 150 kilo-electron Volts (KeV) to about 300 KeV.

5. The method of claim 3, further including forming a second doped region of the first conductivity type in a second portion of the first layer of semiconductor material.

6. The method of claim 5, wherein forming the first capacitor electrode includes diffusing impurity materials from the first and second doped regions so that a portion of the impurity material from the first doped region overlaps a portion of the impurity material from the second doped region.

7. The method of claim 6, wherein forming the second capacitor electrode comprises:
    forming an isolation structure from the second layer of semiconductor material;
    forming an opening in the isolation structure; and
    disposing a second capacitor electrode material in the opening.

8. The method of claim 7, wherein disposing the second capacitor electrode material in the opening includes disposing a semiconductor material in the opening.

9. The method of claim 8, wherein disposing the semiconductor material in the opening includes disposing a doped semiconductor material in the opening, wherein the doped semiconductor material is of the first conductivity type and a first concentration.

10. The method of claim 9, further including forming a first electrical contact to the first doped region and a second electrical contact to the doped semiconductor material.

11. The method of claim 9, further including disposing additional semiconductor material over the doped semiconductor material in the opening, wherein the additional semiconductor material is of the first conductivity type and a second concentration, the second concentration less than the first concentration.

12. The method of claim 11, wherein the second concentration is at least ten times less than the first concentration.

13. The method of claim 11, further including disposing a layer of dielectric material over the doped semiconductor material, wherein the dielectric material is between the doped semiconductor material of the first concentration and the additional semiconductor material of the second concentration.

14. The method of claim 13, further including forming a first electrical contact to the first doped region and forming a second electrical contact to the doped semiconductor material.

15. The method of claim 13, further including forming a plurality of conductors from the doped semiconductor material.

16. The method of claim 13, wherein the doped semiconductor material is polysilicon and the additional semiconductor material is polysilicon.

17. The method of claim 14, further including forming the plurality of conductors substantially equidistant from each other.

18. The method of claim 1, wherein forming the capacitor dielectric layer comprises forming a layer of oxide on the first layer of semiconductor material.

19. A method for manufacturing a semiconductor component, comprising:
    providing a semiconductor-on-insulator (SOI) substrate comprising a first layer of monocrystalline semiconductor material having a first semiconductor layer surface, a first layer of dielectric material having a first dielectric surface, the first layer of dielectric material disposed on the first layer of monocrystalline semiconductor material, and a second layer of monocrystalline semiconductor material having a second semiconductor layer surface, the second layer of monocrystalline semiconductor material disposed on the first layer of dielectric material;

forming a shallow trench isolation structure in the second layer of monocrystalline semiconductor material;

forming an opening in the shallow trench isolation structure, the opening exposing a portion of the first semiconductor layer surface;

forming a capacitor dielectric layer on the exposed portion of the first semiconductor layer surface; and forming a first polysilicon layer on the capacitor dielectric layer, the first polysilicon layer of a first conductivity type and a first dopant concentration.

20. The method of claim 19, further including forming a second polysilicon layer on the first polysilicon layer, the second polysilicon layer of the first conductivity type and a second dopant concentration.

21. The method of claim 20, further including forming a second layer of dielectric material on the first polysilicon layer, wherein the second layer of dielectric material is between the first polysilicon layer and the second polysilicon layer.

22. The method of claim 19, further including forming a first doped region of the first conductivity type in the first layer of monocrystalline semiconductor material.

23. The method of claim 22, further including forming a second doped region of the first conductivity type in the first layer of monocrystalline semiconductor material.

24. The method of claim 23, further including diffusing first and second doped regions so they merge to form a single doped region.

25. The method of claim 19, wherein forming the capacitor dielectric layer includes thermally growing the capacitor dielectric layer.

* * * * *